(12) United States Patent
Shimizu

(10) Patent No.: US 12,408,404 B2
(45) Date of Patent: Sep. 2, 2025

(54) METHOD FOR MANUFACTURING SEMICONDUCTOR DEVICE, SEMICONDUCTOR DEVICE, INVERTER CIRCUIT, DRIVING DEVICE, VEHICLE, AND ELEVATOR

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 496 days.

(21) Appl. No.: 17/822,970

(22) Filed: Aug. 29, 2022

(65) Prior Publication Data
US 2023/0299152 A1    Sep. 21, 2023

(30) Foreign Application Priority Data
Mar. 16, 2022   (JP) ................. 2022-041805

(51) Int. Cl.
*H10D 64/01* (2025.01)
*H01L 21/04* (2006.01)
(Continued)

(52) U.S. Cl.
CPC ......... *H10D 64/01* (2025.01); *H01L 21/0485* (2013.01); *H10D 12/031* (2025.01);
(Continued)

(58) Field of Classification Search
CPC ............ H01L 21/0465; H01L 21/0485; H10D 12/031; H10D 12/441; H10D 30/66;
(Continued)

(56) References Cited

U.S. PATENT DOCUMENTS

| 5,622,743 A | 4/1997 | Tanaka et al. |
| 6,235,616 B1 * | 5/2001 | Itoh ............ H01L 21/046 |
| | | 257/E21.057 |

(Continued)

FOREIGN PATENT DOCUMENTS

| JP | 8-66176 A | 3/1996 |
| JP | 2002-359241 A | 12/2002 |

(Continued)

*Primary Examiner* — Eric A. Ward
(74) *Attorney, Agent, or Firm* — Oblon, McClelland, Maier & Neustadt, L.L.P.

(57) ABSTRACT

Provided is a method for manufacturing a semiconductor device, the method including: performing first ion implantation ion-implanting a p-type impurity into a silicon carbide layer; performing second ion implantation ion-implanting carbon (C) into the silicon carbide layer; performing a first heat treatment activating the p-type impurity; performing a first oxidation treatment oxidizing the silicon carbide layer; performing an etching treatment etching the silicon carbide layer in an atmosphere containing hydrogen gas; forming a first metal film containing at least one metal element selected from the group consisting of nickel, palladium, platinum, and chromium; performing a second heat treatment causing the silicon carbide layer to react with the first metal film to form a metal silicide layer containing the at least one metal element; and forming a second metal film having a chemical composition different from a chemical composition of the first metal film.

17 Claims, 46 Drawing Sheets

(51) Int. Cl.
 *H10D 12/01* (2025.01)
 *H10D 62/832* (2025.01)
 *H10D 64/62* (2025.01)
 *H10D 30/66* (2025.01)
 *H10D 62/834* (2025.01)
(52) U.S. Cl.
 CPC ......... *H10D 62/8325* (2025.01); *H10D 64/62* (2025.01); *H01L 21/0465* (2013.01); *H10D 30/66* (2025.01); *H10D 62/834* (2025.01)
(58) Field of Classification Search
 CPC .. H10D 62/8325; H10D 62/834; H10D 64/01; H10D 64/62
 See application file for complete search history.

(56) References Cited

U.S. PATENT DOCUMENTS

| | | | |
|---|---|---|---|
| 10,062,759 | B2 | 8/2018 | Hisamoto et al. |
| 10,700,167 | B2 | 6/2020 | Kitamura et al. |
| 2002/0182845 | A1 | 12/2002 | Miyano et al. |
| 2003/0068582 | A1 | 4/2003 | Komada et al. |
| 2012/0214309 | A1* | 8/2012 | Itoh ............... H01L 21/049 |
| | | | 156/345.31 |
| 2013/0062623 | A1 | 3/2013 | Shimizu et al. |
| 2018/0308936 | A1* | 10/2018 | Shimizu ............. H10D 62/8325 |
| 2021/0288158 | A1 | 9/2021 | Shimizu |
| 2022/0005925 | A1 | 1/2022 | Shimizu et al. |
| 2022/0028688 | A1 | 1/2022 | Sakai et al. |

FOREIGN PATENT DOCUMENTS

| | | | |
|---|---|---|---|
| JP | 2003-124189 | A | 4/2003 |
| JP | 2008-227319 | A | 9/2008 |
| JP | 2013-58668 | A | 3/2013 |
| JP | 2014-143248 | A | 8/2014 |
| JP | 2016-46309 | A | 4/2016 |
| JP | 2018-98227 | A | 6/2018 |
| JP | 2018-186125 | A | 11/2018 |
| JP | 2021-145112 | A | 9/2021 |
| JP | 2022-12282 | A | 1/2022 |
| JP | 2022-20995 | A | 2/2022 |
| WO | WO 2014/155651 | | 10/2014 |

* cited by examiner

METHOD FOR MANUFACTURING SEMICONDUCTOR DEVICE, SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2022-041805, filed on Mar. 16, 2022, the entire contents of which are incorporated herein by reference.

FIELD

Embodiments described herein relate generally to a method for manufacturing a semiconductor device, a semiconductor device, an inverter circuit, a driving device, a vehicle, and an elevator.

BACKGROUND

Silicon carbide (SiC) is expected as a material for next-generation semiconductor devices. As compared with silicon (Si), silicon carbide is excellent in physical properties, for example, about three times the band gap, about ten times the breakdown field strength, and about three time the thermal conductivity. By utilizing these physical properties, a semiconductor device capable of performing low-loss operation and operating at a high temperature can be realized.

In a device using the silicon carbide, it is desired to reduce contact resistance between a silicon carbide layer and a metal electrode in order to improve a device property.

DETAILED DESCRIPTION

Figure 1:
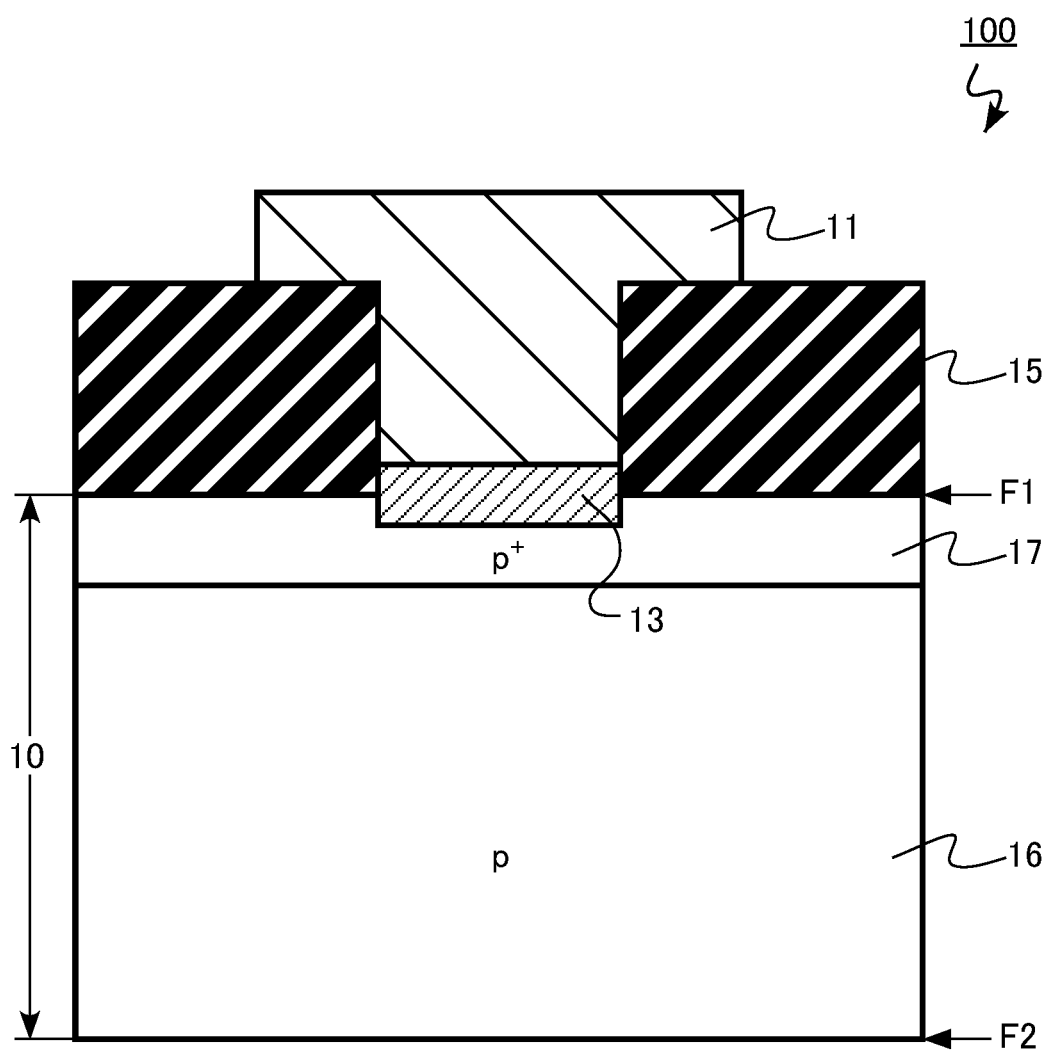
FIG. 1 is a schematic cross-sectional view of a semiconductor device manufactured by a method for manufacturing a semiconductor device according to a first embodiment.

A method for manufacturing a semiconductor device according to the embodiment includes: performing first ion implantation of ion-implanting a p-type impurity into a silicon carbide layer in a first projected range and by a first dose amount; performing second ion implantation of ion-implanting carbon (C) into the silicon carbide layer in a second projected range and by a second dose amount; performing a first heat treatment for activating the p-type impurity; performing a first oxidation treatment of oxidizing the silicon carbide layer; performing an etching treatment of etching the silicon carbide layer in an atmosphere containing hydrogen gas; forming, on the silicon carbide layer, a first metal film containing at least one metal element selected from a group consisting of nickel (Ni), palladium (Pd), platinum (Pt), and chromium (Cr); performing a second heat treatment for causing the silicon carbide layer to react with the first metal film to form a metal silicide layer containing the at least one metal element; and forming, on the silicon carbide layer, a second metal film having a chemical composition different from a chemical composition of the first metal film.

Hereinafter, embodiments of the present disclosure will be described with reference to the drawings. In the following description, the same or similar members are denoted by the same reference numerals, and the description of the members described once is appropriately omitted.

In the following description, in a case where notations of $n^+$, n, and $n^-$, and notations of $p^+$, p, and $p^-$ are used, these notations represent the relative level of impurity concentration in each conductivity type. That is, it is indicated that $n^+$ has n-type impurity concentration relatively higher than that of n, and $n^-$ has the n-type impurity concentration relatively lower than that of n. It is indicated that $p^+$ has p-type impurity concentration relatively higher than that of p, and $p^-$ has the p-type impurity concentration relatively lower than that of p. $n^+$-type and $n^-$-type may be simply referred to as n-type, and $p^+$-type and $p^-$-type may be simply referred to as p-type. Unless otherwise specified, the impurity concentration of each region is represented by, for example, a value of the impurity concentration in the central portion of each region.

The impurity concentration can be measured by, for example, secondary ion mass spectrometry (SIMS). The relative level of the impurity concentration can also be determined based on the level of carrier concentration obtained by, for example, scanning capacitance microscopy (SCM). A distance such as the width and depth of an impurity region can be obtained by, for example, the SIMS. The distance such as the width and depth of an impurity region can be obtained from, for example, an SCM image.

The thickness or the like of an insulating layer can be measured, for example, by using images of the SIMS or a transmission electron microscope (TEM).

The magnitude relationship among a ratio of a metal element in a silicon carbide layer, which is located at a silicon site in a crystal structure of silicon carbide, a ratio of the metal element located at a carbon site in the crystal structure of the silicon carbide, and a ratio of the metal element located at the interstitial site in the crystal structure of the silicon carbide can be determined by using, for example, Raman spectroscopy or X-ray photoelectron spectroscopy (XPS).

For identification of a silicide phase present in a metal silicide layer and determination of a magnitude relationship of the amount of the silicide phase present in the metal silicide layer, for example, X-ray photoelectron spectroscopy (XPS), infrared spectroscopy (Infrared Spectroscopy), or Raman spectroscopy is used.

First Embodiment

A method for manufacturing a semiconductor device according to the first embodiment includes: performing first ion implantation of ion-implanting a p-type impurity into a silicon carbide layer in a first projected range and by a first dose amount; performing second ion implantation of ion-implanting carbon (C) into the silicon carbide layer in a second projected range and by a second dose amount; performing a first heat treatment for activating the p-type impurity; performing a first oxidation treatment of oxidizing the silicon carbide layer; performing an etching treatment of etching the silicon carbide layer in an atmosphere containing hydrogen gas; forming, on the silicon carbide layer, a first metal film containing at least one metal element selected from a group consisting of nickel (Ni), palladium (Pd), platinum (Pt), and chromium (Cr); performing a second heat treatment for causing the silicon carbide layer to react with the first metal film to form a metal silicide layer containing the at least one metal element; and forming, on the silicon carbide layer, a second metal film having a chemical composition different from a chemical composition of the first metal film.

FIG. 1 is a schematic cross-sectional view of a semiconductor device manufactured by the method for manufacturing a semiconductor device according to the first embodiment. The semiconductor device of the first embodiment is a semiconductor device including a contact structure 100.

The contact structure 100 includes a silicon carbide layer 10, a contact electrode 11, a metal silicide layer 13, and an insulating layer 15.

The silicon carbide layer 10 includes a p-type low-concentration region 16 and a p-type high-concentration region 17.

The silicon carbide layer 10 is, for example, a single crystal of 4H—SiC. The silicon carbide layer 10 has a first surface F1 and a second surface F2. The second surface F2 is opposed to the first surface F1. The first surface F1 is a surface of the silicon carbide layer 10, and the second surface F2 is a back surface of the silicon carbide layer 10.

In the first embodiment, a "depth" means a depth with respect to the first surface F1. Here, the first surface F1 is a virtual plane surface including an interface between the silicon carbide layer 10 and the insulating layer 15.

Hereinafter, a case where the first surface F1 of the silicon carbide layer 10 is a surface inclined at equal to or greater than zero degrees and equal to or less than ten degrees with respect to a silicon face, and the second surface F2 is a surface inclined at equal to or greater than zero degrees and equal to or less than ten degrees with respect to a carbon face will be described as an example. The first surface F1 of the silicon carbide layer has an off angle of equal to or greater than zero degrees and equal to or less than ten degrees with respect to the silicon face.

The p-type low-concentration region 16 is p-type SiC. The p-type low-concentration region 16 contains, for example, aluminum (Al) as a p-type impurity. The p-type impurity concentration of the p-type low-concentration region 16 is, for example, equal to or greater than $1 \times 10^{15}$ cm$^{-3}$ and equal to or less than $5 \times 10^{17}$ cm$^{-3}$.

The p-type high-concentration region 17 is p$^+$-type SiC. The p-type high-concentration region 17 is provided between the p-type low-concentration region 16 and the first surface F1.

The p-type high-concentration region 17 contains, for example, aluminum (Al) as a p-type impurity. The p-type impurity concentration of the p-type high-concentration region 17 is higher than the p-type impurity concentration of the p-type low-concentration region 16. The p-type impurity concentration of the p-type high-concentration region 17 is, for example, equal to or greater than $1 \times 10^{18}$ cm$^{-3}$ and equal to or less than $1 \times 10^{22}$ cm$^{-3}$.

The p-type high-concentration region 17 contains at least one metal element (M) selected from the group consisting of nickel (Ni), palladium (Pd), platinum (Pt), and chromium (Cr). The concentration of the metal element (M) of the p-type high-concentration region 17 is, for example, equal to or greater than $1 \times 10^{18}$ cm$^{-3}$ and equal to or less than $1 \times 10^{21}$ cm$^{-3}$.

Among the metal elements (M) contained in the p-type high-concentration region 17, for example, a ratio of the metal element (M) located at the interstitial site in the crystal structure of the silicon carbide is higher than a ratio of the metal element (M) located at the carbon site in the crystal structure of the silicon carbide.

The insulating layer 15 is formed on the silicon carbide layer 10. The insulating layer 15 is formed of, for example, silicon oxide.

The contact electrode 11 is located on the first surface F1 side of the silicon carbide layer 10. The contact electrode 11 is electrically connected to the p-type high-concentration region 17. The contact electrode 11 is in contact with the metal silicide layer 13.

The contact electrode 11 contains metal. The contact electrode 11 is formed of, for example, aluminum, an aluminum alloy, tungsten, or copper.

For example, a barrier metal film (not illustrated) may be provided between the contact electrode 11 and the metal silicide layer 13. The barrier metal film is formed of, for example, titanium or titanium nitride.

The metal silicide layer 13 is provided between the silicon carbide layer 10 and the contact electrode 11. The metal silicide layer 13 is in contact with the silicon carbide layer 10. The metal silicide layer 13 is in contact with the contact electrode 11.

The metal silicide layer 13 contains, for example, silicide of at least one metal element (M) selected from the group consisting of nickel (Ni), palladium (Pd), platinum (Pt), and chromium (Cr). The metal silicide layer 13 contains, for example, nickel silicide, palladium silicide, platinum silicide, or chromium silicide. The metal silicide layer 13 is formed of, for example, nickel silicide, palladium silicide, platinum silicide, or chromium silicide.

The thickness of the metal silicide layer 13 in a normal direction of the first surface F1 of the silicon carbide layer 10 is, for example, equal to or greater than 50 nm and equal to or less than 500 nm.

Next, an example of the method for manufacturing a semiconductor device according to the first embodiment will be described.

Figure 2:
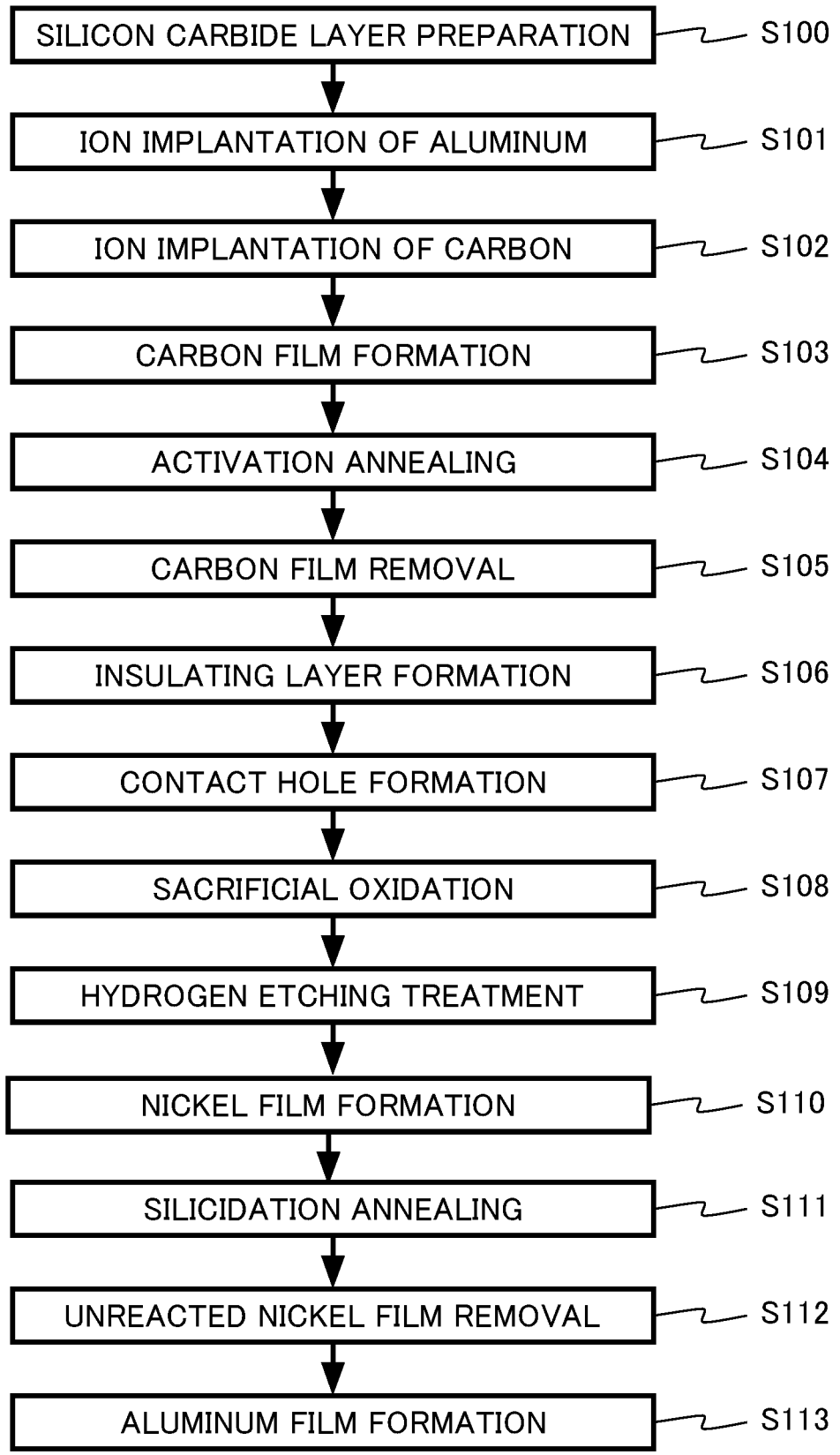
FIG. 2 is a flow chart illustrating a method for manufacturing a semiconductor device according to the first embodiment.

FIG. 2 is a flow chart illustrating the method for manufacturing a semiconductor device according to the first embodiment. FIGS. 3, 4, 5, 6, 7, 8, 9, 10, 11, 12, 13, 14, 15, and 16 are explanatory diagrams of the method for manufacturing a semiconductor device according to the first embodiment. FIGS. 3 to 5 and FIGS. 7 to 16 are cross-sectional views in the middle of manufacturing. FIG. 6 is a diagram illustrating an element distribution immediately after ion implantation.

Hereinafter, a case where the metal element (M) is nickel (Ni) will be described as an example.

As illustrated in FIG. 2, the method for manufacturing a semiconductor device includes silicon carbide layer preparation (step S100), ion implantation of aluminum (step S101), ion implantation of carbon (step S102), carbon film formation (step S103), activation annealing (step S104), carbon film removal (step S105), insulating layer formation (step S106), contact hole formation (step S107), sacrificial oxidation (step S108), a hydrogen etching treatment (step S109), nickel film formation (step S110), silicidation annealing (step S111), unreacted nickel film removal (step S112), and aluminum film formation (step S113).

Figure 3:
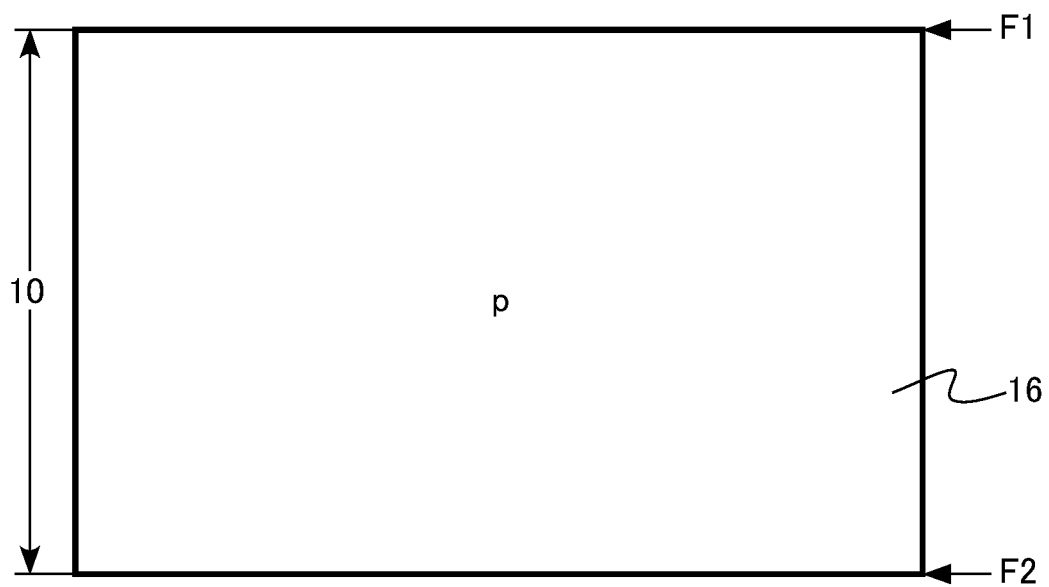
FIG. 3 is an explanatory diagram of a method for manufacturing a semiconductor device according to the first embodiment.

In step S100, the silicon carbide layer 10 is prepared (FIG. 3). The silicon carbide layer 10 includes the p-type low-concentration region 16. The silicon carbide layer 10 has a first surface F1 and a second surface F2.

Figure 4:
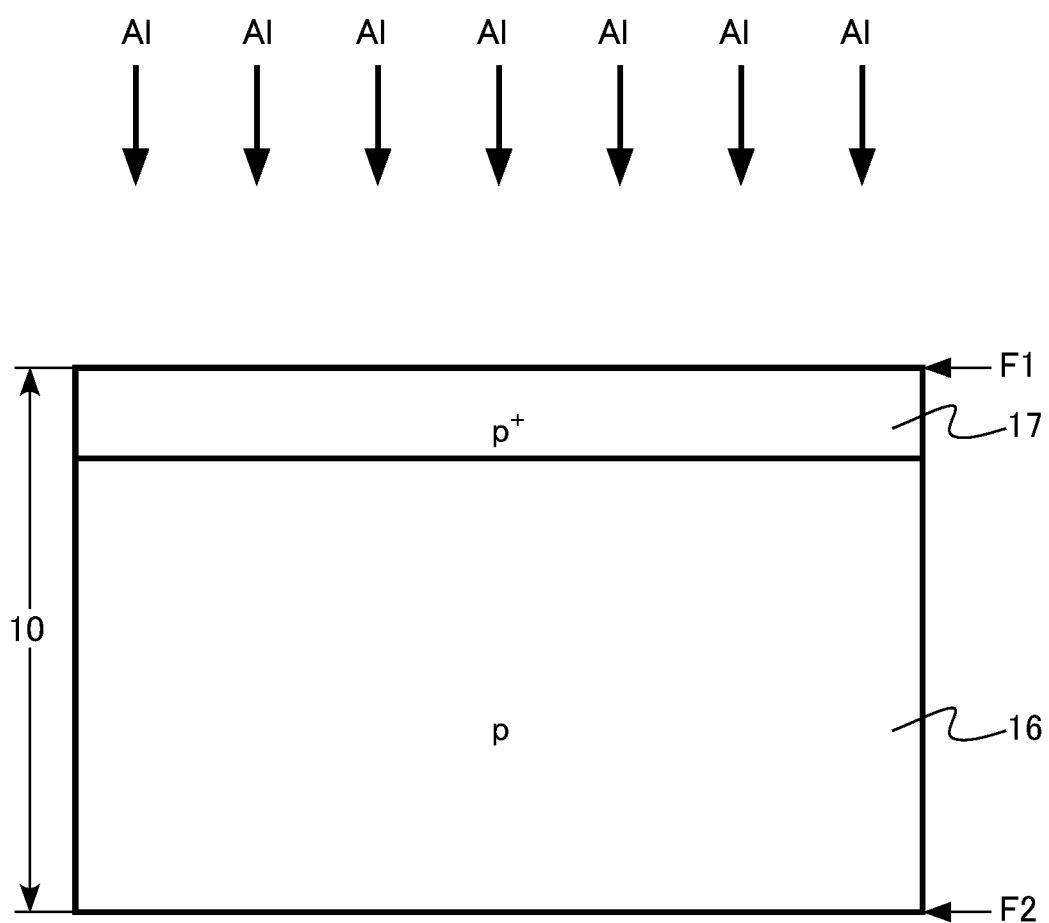
FIG. 4 is an explanatory diagram of a method for manufacturing a semiconductor device according to the first embodiment.

In step S101, aluminum (Al) as the p-type impurity is ion-implanted into the silicon carbide layer 10. The p-type high-concentration region 17 is formed by the ion implantation (FIG. 4).

The ion implantation of aluminum forming the p-type high-concentration region 17 is an example of a first ion implantation. The ion implantation of aluminum is performed in a first projected range and by a first dose amount. The projected range is an average projection range.

The first projected range is, for example, equal to or greater than 0.05 µm and equal to or less than 0.2 µm. The first dose amount is, for example, equal to or greater than $1\times10^{15}$ cm$^{-2}$ and equal to or less than $1\times10^{16}$ cm$^{-2}$.

Figure 5:
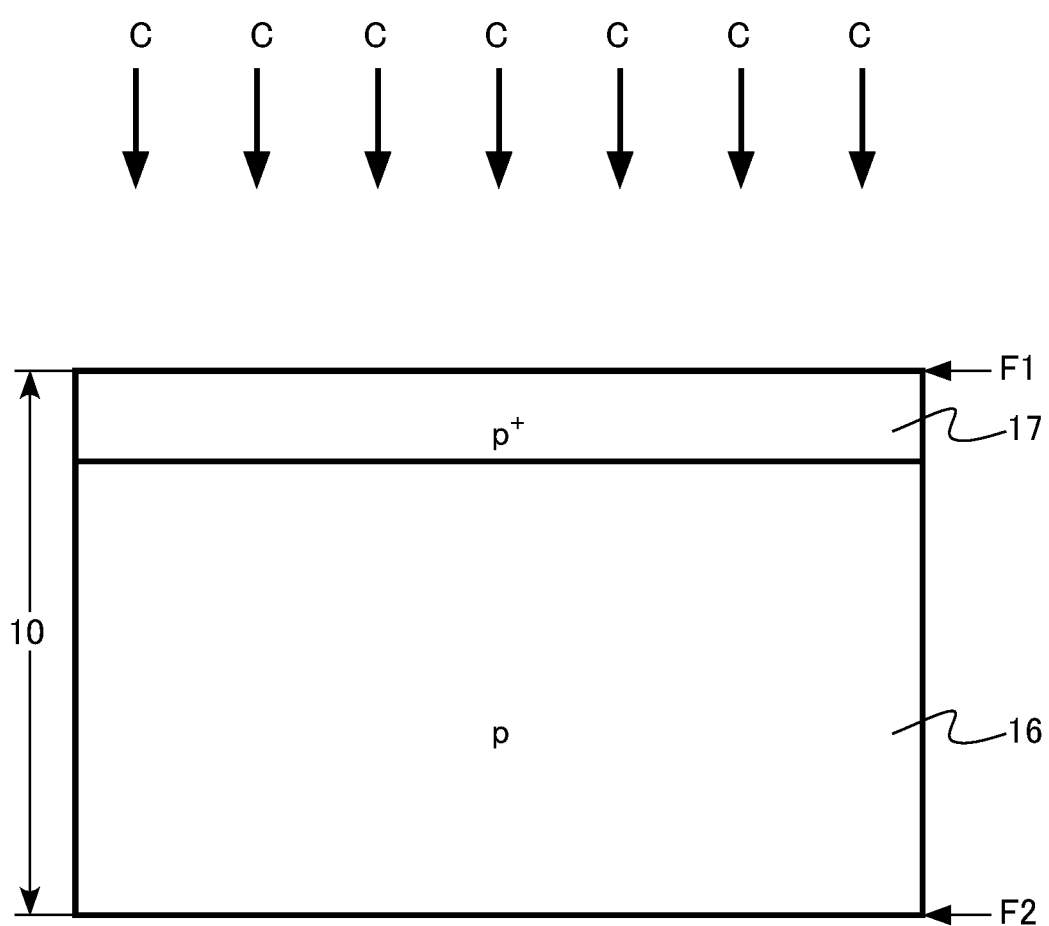
FIG. 5 is an explanatory diagram of a method for manufacturing a semiconductor device according to the first embodiment.
Figure 6:
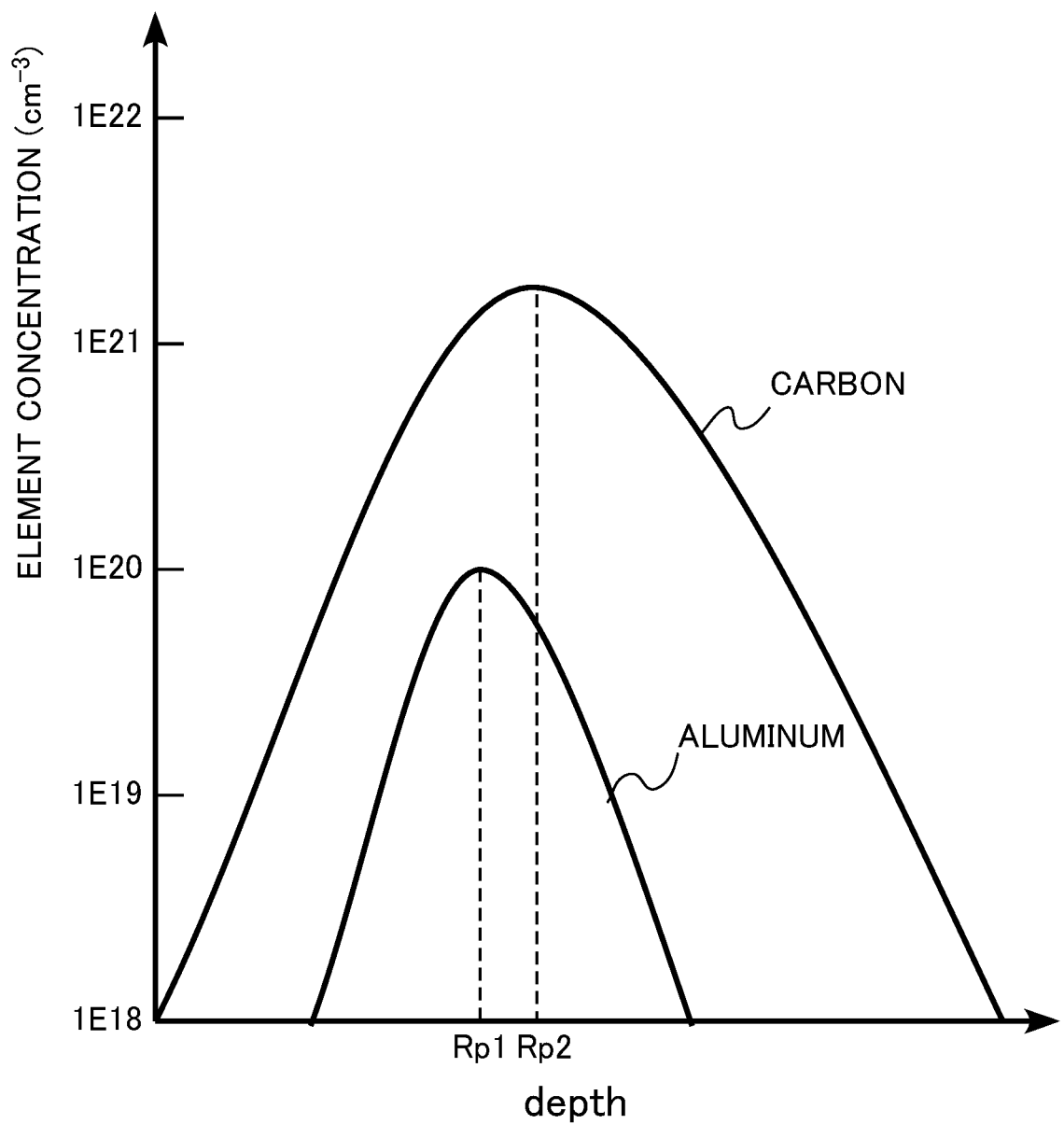
FIG. 6 is an explanatory diagram of a method for manufacturing a semiconductor device according to the first embodiment.

In step S102, carbon is ion-implanted into the p-type high-concentration region 17 (FIG. 5). The ion implantation of carbon into the p-type high-concentration region 17 is an example of a second ion implantation. The ion implantation of carbon is performed in a second projected range and by a second dose amount.

The second projected range is, for example, equal to or greater than 0.05 μm and equal to or less than 0.2 μm. The second projected range is, for example, equal to or greater than 80% and equal to or less than 120% of the first projected range.

The second dose amount is, for example, greater than the first dose amount. The second dose amount is, for example, equal to or greater than ten times the first dose amount. The second dose amount is, for example, equal to or less than one hundred times the first dose amount. The second dose amount is, for example, equal to or greater than $1\times10^{16}$ cm$^{-2}$ and equal to or less than $1\times10^{18}$ cm$^{-2}$.

FIG. 6 illustrates a concentration distribution of aluminum implanted into the silicon carbide layer 10 by the first ion implantation and a concentration distribution of carbon implanted into the silicon carbide layer 10 by the second ion implantation. FIG. 6 is a diagram illustrating an element distribution immediately after the ion implantation.

As illustrated in FIG. 6, a second projected range Rp2 of the ion implantation of carbon is located in the vicinity of a first projected range Rp1 of the ion implantation of aluminum. Since the second dose amount of the ion implantation of carbon is greater than the first dose amount of the ion implantation of aluminum, the concentration distribution of carbon after the ion implantation completely covers, for example, the concentration distribution of aluminum after the ion implantation.

The concentration at a peak of the distribution of aluminum is, for example, equal to or greater than $1\times10^{19}$ cm$^{-3}$ and equal to or less than $1\times10^{21}$ cm$^{-3}$. The concentration at a peak of the distribution of carbon is, for example, equal to or greater than $1\times10^{20}$ cm$^{-3}$ and equal to or less than $1\times10^{22}$ cm$^{-3}$.

Figure 7:
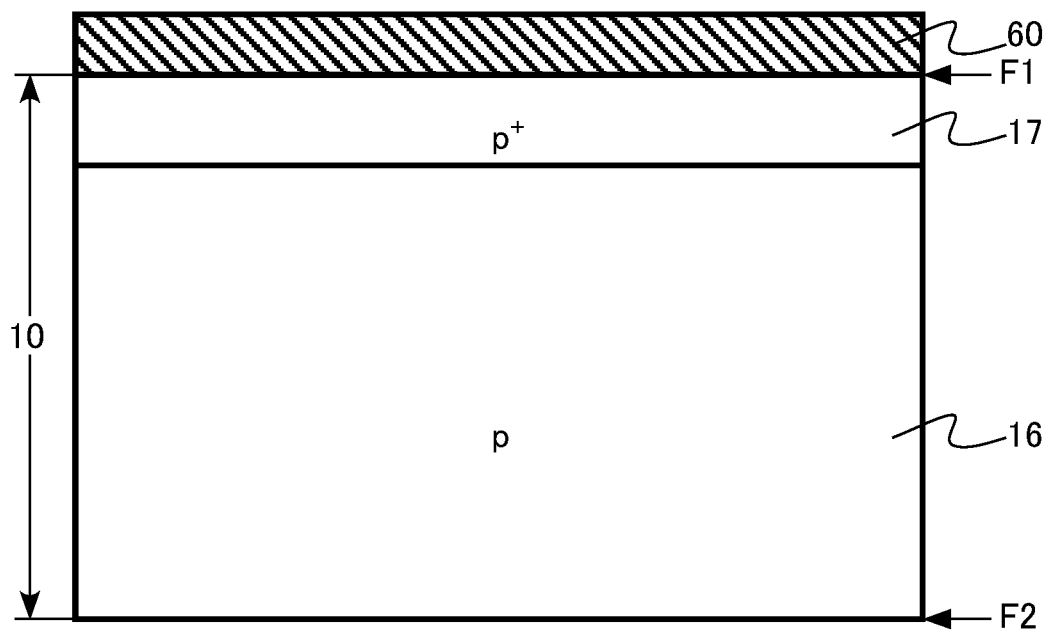
FIG. 7 is an explanatory diagram of a method for manufacturing a semiconductor device according to the first embodiment.

In step S103, a carbon film 60 is formed on the silicon carbide layer 10 (FIG. 7).

In step S104, a first heat treatment is performed. The first heat treatment is activation annealing for activating ion-implanted aluminum.

The first heat treatment is performed, for example, at equal to or higher than 1600° C. The first heat treatment is performed, for example, at equal to or lower than 2000° C. The first heat treatment is performed, for example, in a non-oxidizing atmosphere. The first heat treatment is performed, for example, in an inert gas atmosphere. The first heat treatment is performed, for example, in an argon gas atmosphere.

By the first heat treatment, interstitial carbon formed by ion implantation of carbon into the silicon carbide layer 10 fills a carbon vacancy in the silicon carbide layer 10.

The carbon film 60 prevents silicon and carbon from being desorbed from the silicon carbide layer 10 into the atmosphere during the first heat treatment. The carbon film 60 absorbs excessive interstitial carbon in the silicon carbide layer 10 during the first heat treatment.

The first heat treatment includes, for example, a first step in which a temperature is equal to or greater than 1600° C. and a second step in which a temperature is lower than that of the first step. In the second step, the temperature is, for example, equal to or lower than 1000° C.

For example, in the first step, aluminum ion-implanted into the silicon carbide layer 10 is activated, and the interstitial carbon fills the carbon vacancy. For example, in the second step in which the temperature is low, excessive interstitial carbon is expelled from the silicon carbide layer 10 and absorbed by the carbon film 60.

Figure 8:
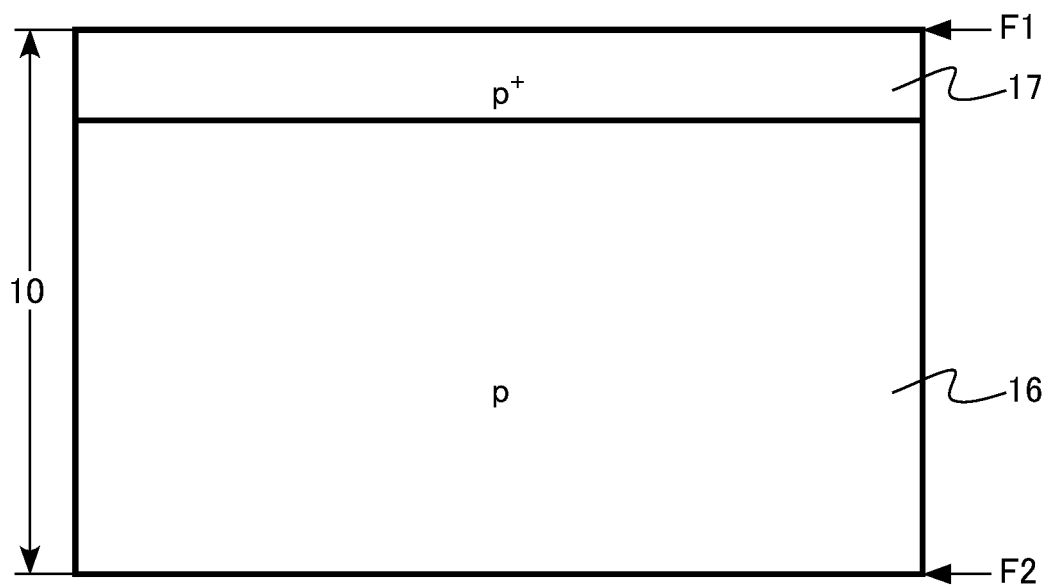
FIG. 8 is an explanatory diagram of a method for manufacturing a semiconductor device according to the first embodiment.

In step S105, the carbon film 60 is removed (FIG. 8). The carbon film 60 is removed by an ashing treatment using oxygen plasma. The carbon film 60 is removed in the oxygen plasma.

During the ashing treatment using oxygen plasma, the surface of the silicon carbide layer 10 is oxidized. The ashing treatment using oxygen plasma is an example of a first oxidation treatment.

Figure 9:
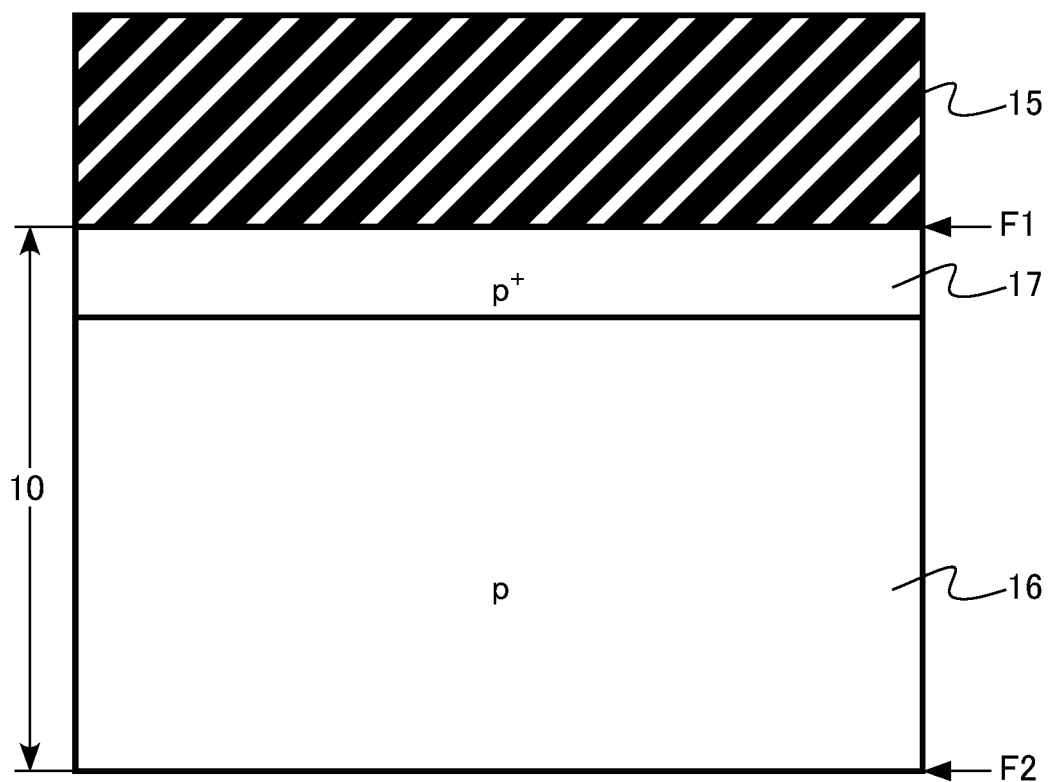
FIG. 9 is an explanatory diagram of a method for manufacturing a semiconductor device according to the first embodiment.

In step S106, the insulating layer 15 is formed on the silicon carbide layer 10 (FIG. 9). The insulating layer 15 is formed using, for example, a chemical vapor deposition method (CVD method). The insulating layer 15 is formed of, for example, silicon oxide.

Figure 10:
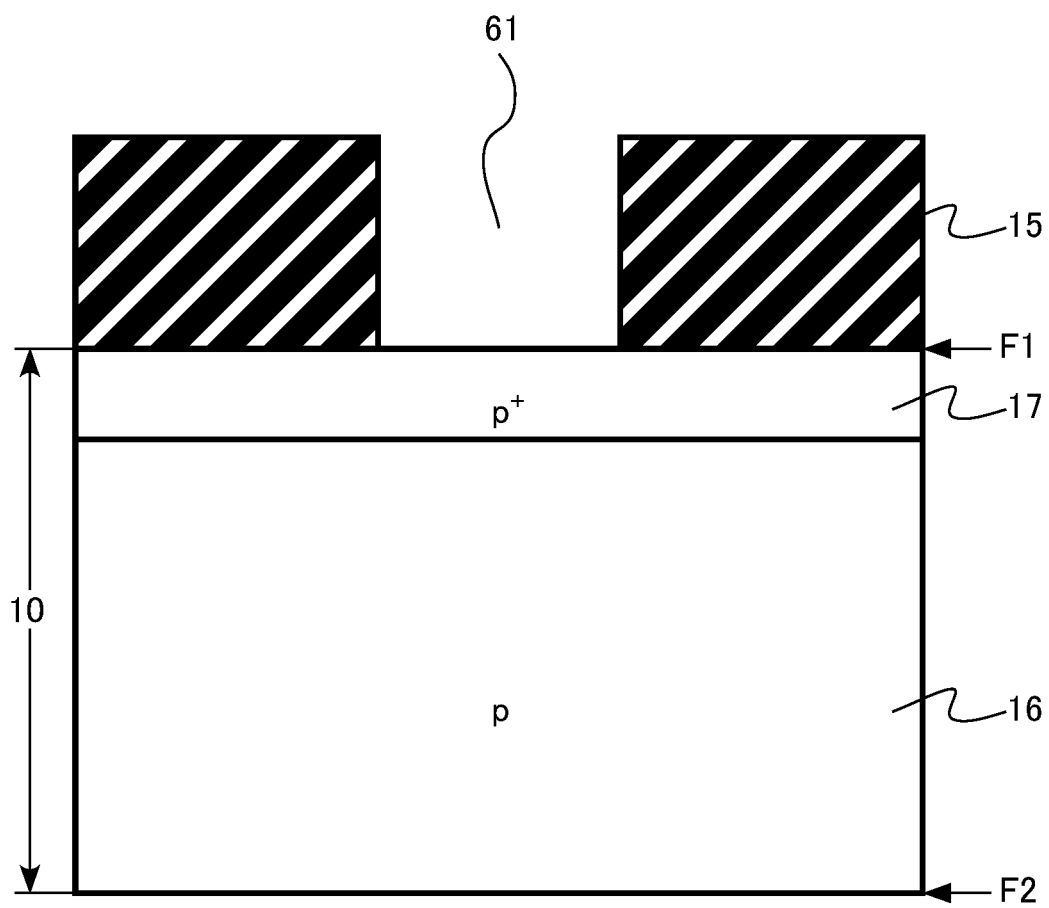
FIG. 10 is an explanatory diagram of a method for manufacturing a semiconductor device according to the first embodiment.

In step S107, a contact hole 61 is formed in the insulating layer 15 (FIG. 10). The contact hole 61 is an example of an opening. The silicon carbide layer 10 is exposed at the bottom portion of the contact hole 61. The p-type high-concentration region 17 is exposed at the bottom portion of the contact hole 61.

The contact hole 61 is formed by, for example, patterning using photolithography and etching.

Figure 11:
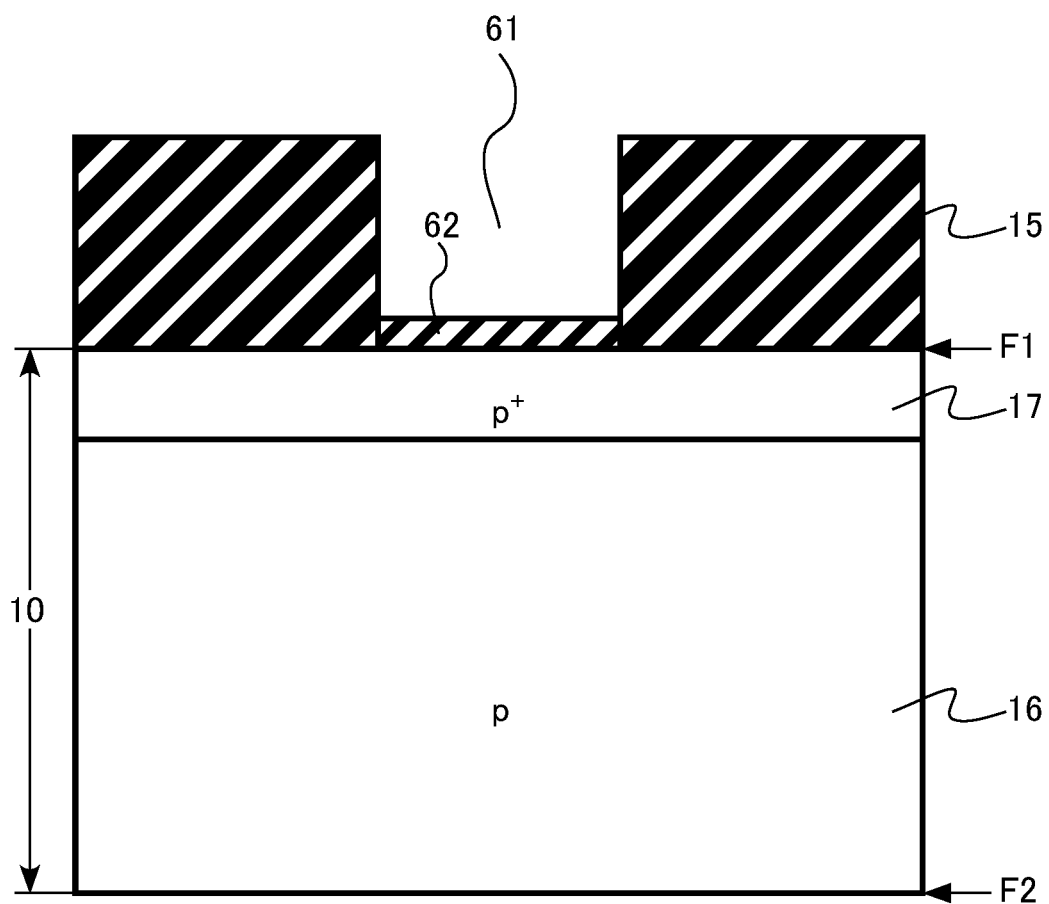
FIG. 11 is an explanatory diagram of a method for manufacturing a semiconductor device according to the first embodiment.

In step S108, the sacrificial oxidation of the silicon carbide layer 10 is performed. The sacrificial oxidation is thermal oxidation. A sacrificial oxide film 62 is formed on the silicon carbide layer 10 by sacrificial oxidation (FIG. 11). The sacrificial oxidation is an example of a second oxidation treatment.

The sacrificial oxide film 62 is a silicon oxide film. By forming the sacrificial oxide film 62, for example, the impurity and damage on the surface of the silicon carbide layer 10 are removed.

Next, the sacrificial oxide film 62 is removed. The sacrificial oxide film 62 is removed using, for example, a wet etching method.

Figure 12:
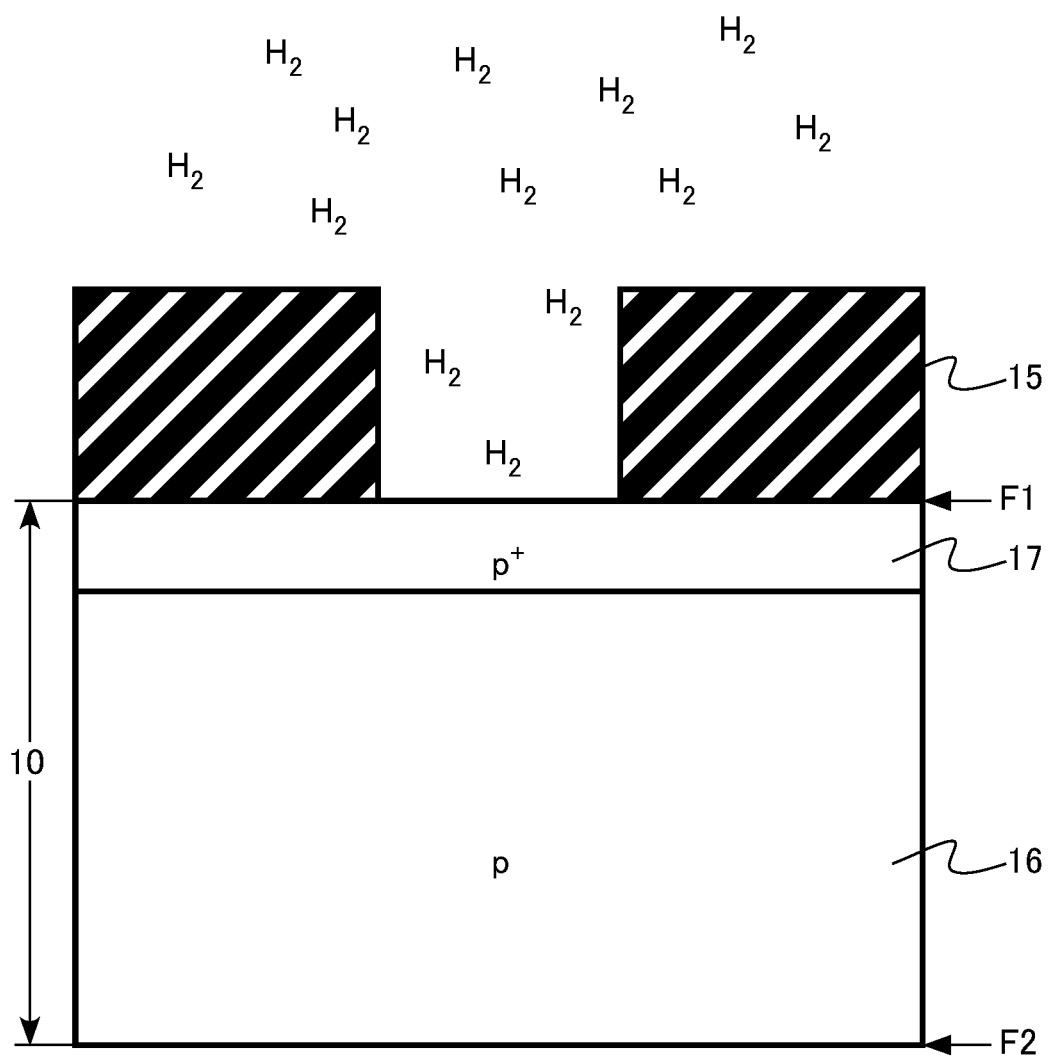
FIG. 12 is an explanatory diagram of a method for manufacturing a semiconductor device according to the first embodiment.

In step S109, the hydrogen etching treatment for etching the surface of the silicon carbide layer 10 in an atmosphere containing hydrogen gas is performed (FIG. 12). The temperature of the hydrogen etching treatment is, for example, equal to or higher than 1300° C. and equal to or lower than 1500° C. The surface of the silicon carbide layer 10 is etched by, for example, equal to or greater than 25 nm and equal to or less than 100 nm by performing the hydrogen etching treatment.

The partial pressure of the hydrogen gas in the atmosphere of the hydrogen etching treatment is, for example, equal to or greater than 90%. The partial pressure of the hydrogen gas in the atmosphere of the hydrogen etching treatment is, for example, equal to or greater than 95%. The partial pressure of the hydrogen gas in the atmosphere of the hydrogen etching treatment is, for example, 100%. The atmosphere of the hydrogen etching treatment may include, for example, argon gas.

Figure 13:
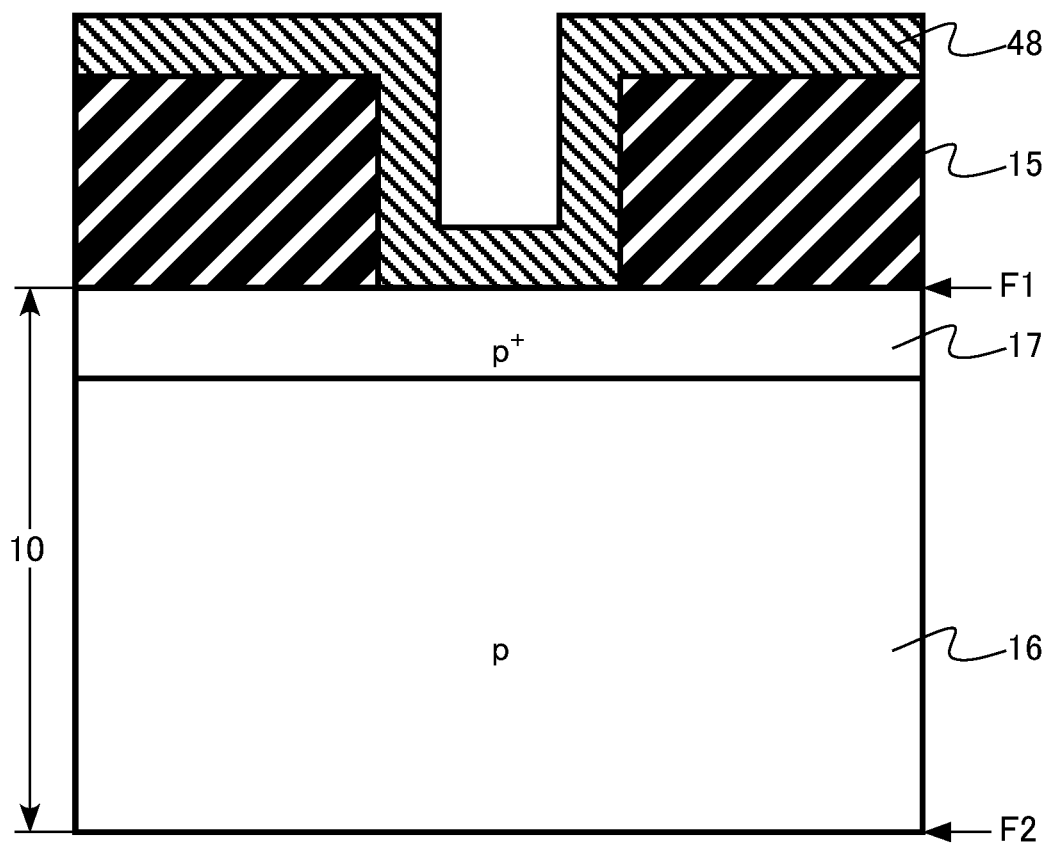
FIG. 13 is an explanatory diagram of a method for manufacturing a semiconductor device according to the first embodiment.

In step S110, a nickel film 48 is formed on the silicon carbide layer 10 (FIG. 13). The nickel film 48 is an example of a first metal film. Nickel (Ni) is an example of a metal element. The nickel film 48 is formed using, for example, a sputtering method.

Figure 14:
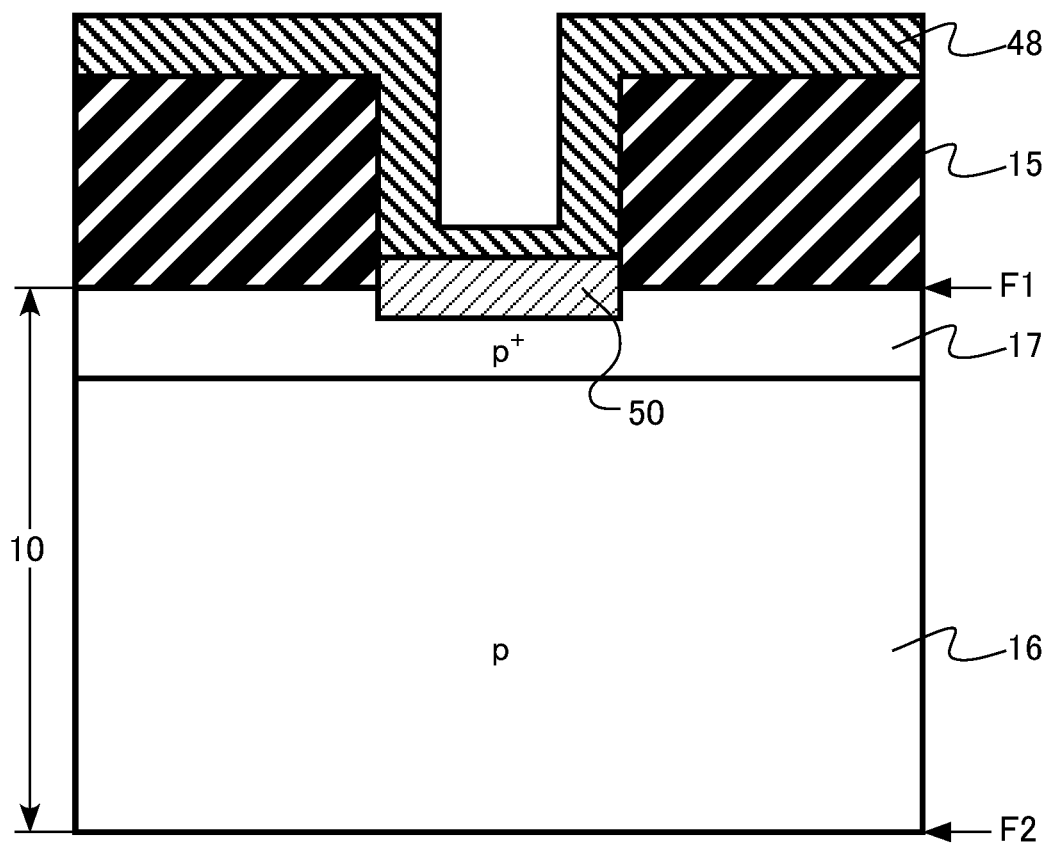
FIG. 14 is an explanatory diagram of a method for manufacturing a semiconductor device according to the first embodiment.

In step S111, silicidation annealing is performed. A nickel silicide layer 50 is formed by causing the silicon carbide layer 10 to react with the nickel film 48 by silicidation annealing (FIG. 14). The nickel silicide layer 50 is an example of the metal silicide layer 13.

The silicidation annealing is performed, for example, in an atmosphere containing nitrogen. The silicidation annealing is performed, for example, in an atmosphere containing nitrogen gas. The temperature of the silicidation annealing is, for example, equal to or higher than 500° C. and lower than 900° C.

At the time of silicidation annealing, the nickel is diffused from the nickel film 48 into the silicon carbide layer 10. The nickel is diffused into the p-type high-concentration region 17 at the time of silicidation annealing.

Figure 15:
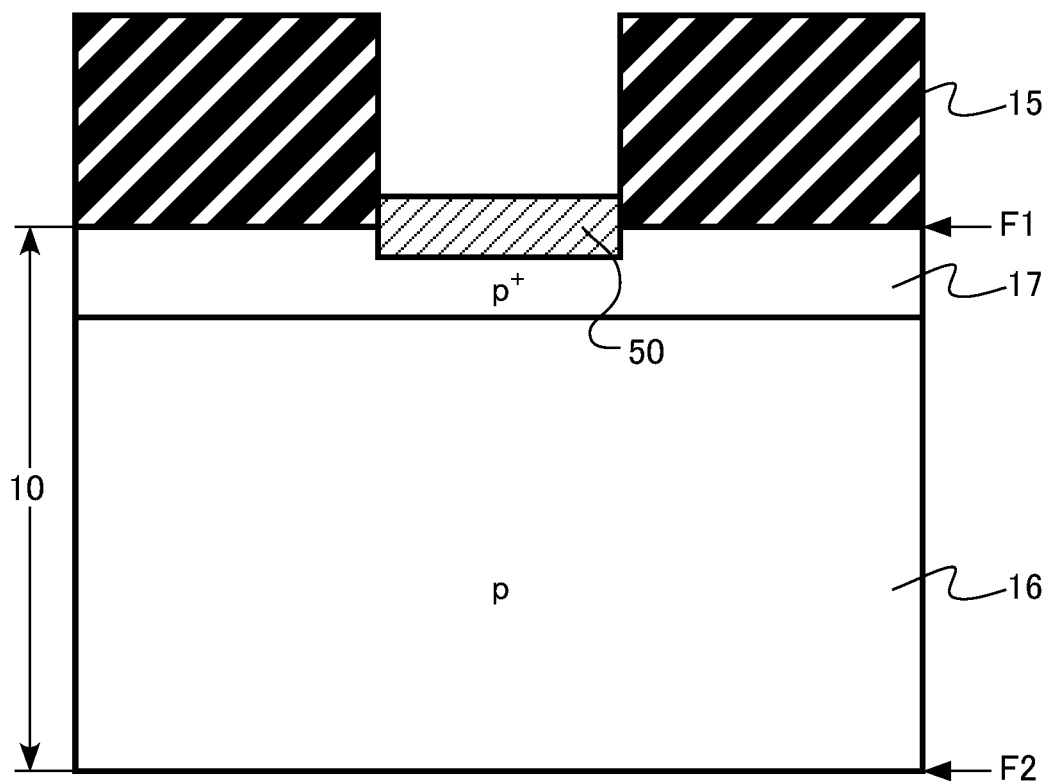
FIG. 15 is an explanatory diagram of a method for manufacturing a semiconductor device according to the first embodiment.

In step S112, an unreacted nickel film 48 is removed (FIG. 15). The unreacted nickel film is removed by, for example, wet etching.

Figure 16:
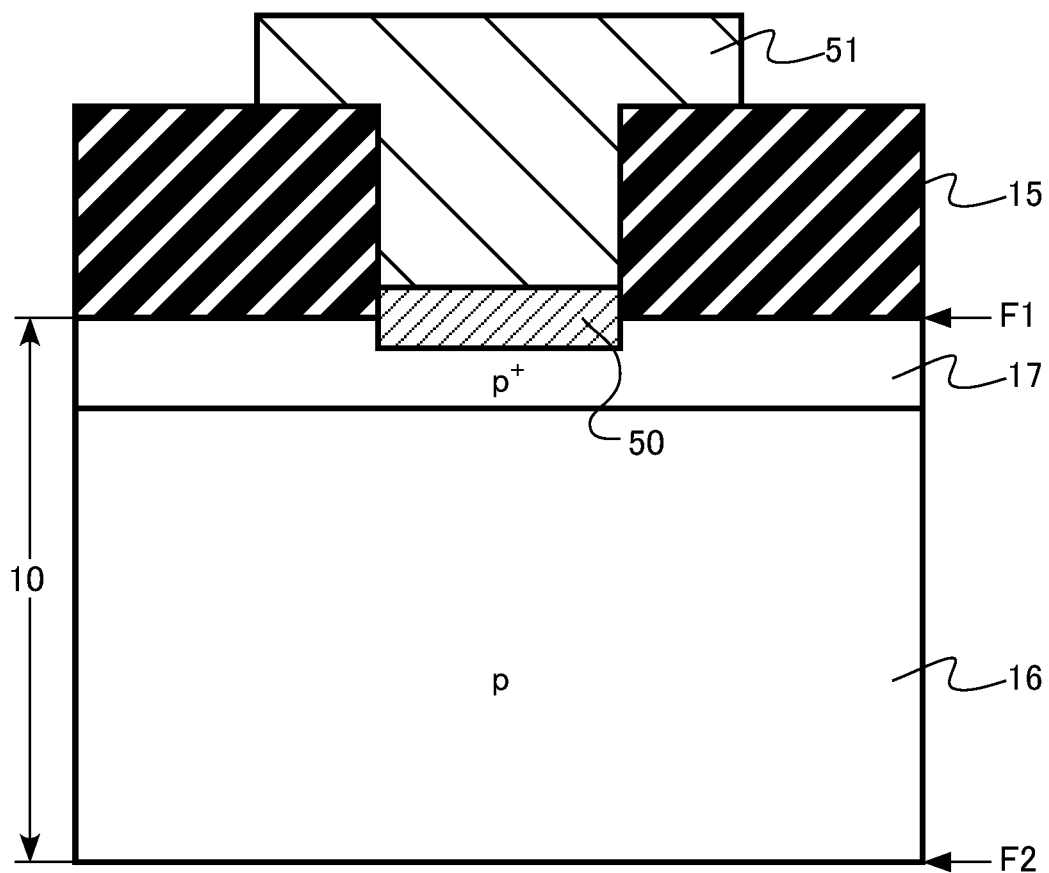
FIG. 16 is an explanatory diagram of a method for manufacturing a semiconductor device according to the first embodiment.

Thereafter, in step S113, an aluminum film 51 is formed on the nickel silicide layer 50 (FIG. 16). The aluminum film 51 is an example of a second metal film. The second metal film has a chemical composition different from that of the first metal film. The aluminum film 51 is formed by, for example, a sputtering method.

The aluminum film 51 is patterned to finally become the contact electrode 11.

The contact structure 100 illustrated in FIG. 1 is formed by the manufacturing method described above.

Next, a function and an effect of the method for manufacturing a semiconductor device according to the first embodiment will be described.

In the method for manufacturing the contact structure 100 of the first embodiment, when the p-type high-concentration region 17 is formed, carbon is ion-implanted in addition to the ion implantation of aluminum. After the oxidation treatment, the surface of the p-type high-concentration region 17 is etched by the hydrogen etching treatment before the metal silicide layer 13 is formed. In the above-described method, the amount of carbon vacancies in the p-type high-concentration region 17 is reduced. Therefore, the contact resistance between the p-type high-concentration region 17 and the contact electrode 11 decreases. Details will be described below.

In the semiconductor device using silicon carbide, from the viewpoint of improving the property of the semiconductor device, it is desirable to reduce the contact resistance between the p-type impurity region and the electrode and the contact resistance between the n-type impurity region and the electrode.

In the contact structure 100, the metal silicide layer 13 is provided between the p-type high-concentration region 17 and the contact electrode 11. By using the metal silicide layer 13, the contact resistance between the p-type high-concentration region 17 and the contact electrode 11 decreases.

In general, it is known that the contact resistance between an n-type silicon carbide region and the metal silicide layer decreases as the temperature of silicidation annealing increases. On the other hand, it is known that the contact resistance between a p-type silicon carbide region and the metal silicide layer increases as the temperature of silicidation annealing increases.

Therefore, it is difficult to simultaneously reduce both the contact resistance between the n-type silicon carbide region and the electrode, and the contact resistance between the p-type silicon carbide region and the electrode.

In a case where the metal element (M) contained in the metal silicide layer is one selected from the group consisting of nickel (Ni), palladium (Pd), platinum (Pt), and chromium (Cr), the following facts have been revealed as a result of the first principle calculation by the inventor.

That is, it has been revealed that the metal element (M) easily enters the carbon site in the crystal structure of silicon carbide at a high temperature of equal to or higher than 900° C., and easily enters the interstitial site of the crystal structure of the silicon carbide at a low temperature of lower than 900° C. It has been revealed that the metal element (M) entering the carbon site functions as a donor, and the metal element (M) entering the interstitial site functions as an acceptor.

FIGS. 17A, 17B, 18A, and 18B are diagrams illustrating a function and an effect of the method for manufacturing a semiconductor device according to the first embodiment. FIGS. 17A, 17B, 18A, and 18B are band diagrams of silicon carbide.

Figure 17A:
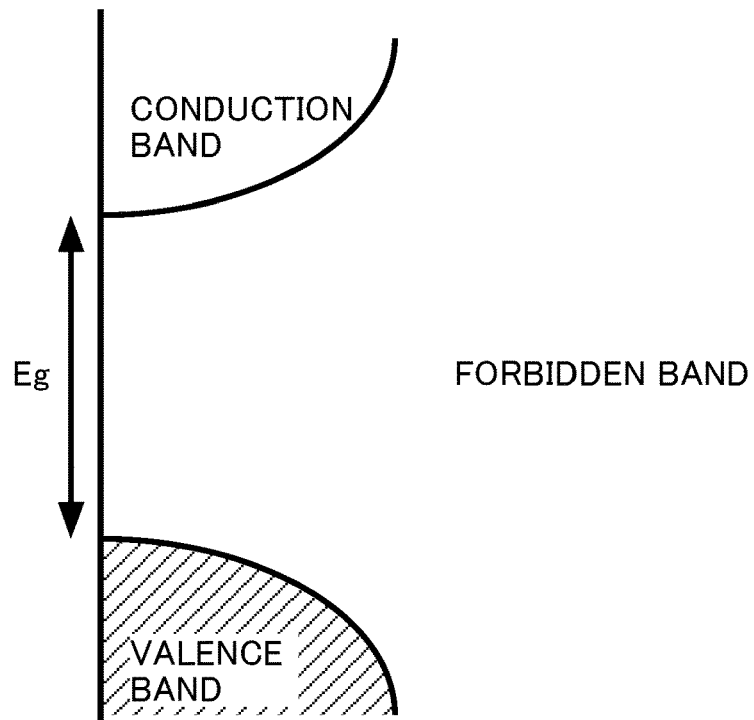
FIGS. 17A and 17B are diagrams illustrating a function and an effect of a method for manufacturing a semiconductor device according to the first embodiment.
Figure 17B:
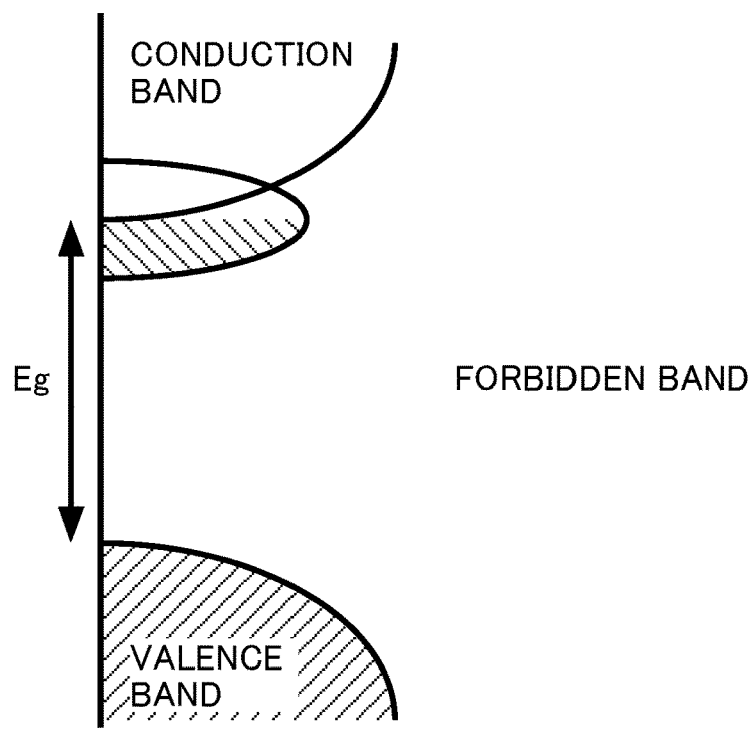

FIGS. 17A and 17B are explanatory diagrams in a case where the metal element (M) enters the carbon site in the crystal structure of the silicon carbide. FIG. 17A illustrates a case where the metal element (M) is not present in the silicon carbide layer, and FIG. 17B illustrates a case where the metal element (M) is present in the silicon carbide layer.

As illustrated in FIG. 17B, in a case where the metal element (M) enters the carbon site in the crystal structure of the silicon carbide, a donor level due to the metal element (M) is formed at a lower end of a conduction band, and electrons are supplied to the conduction band. The metal element (M) functions as a donor.

Figure 18A:
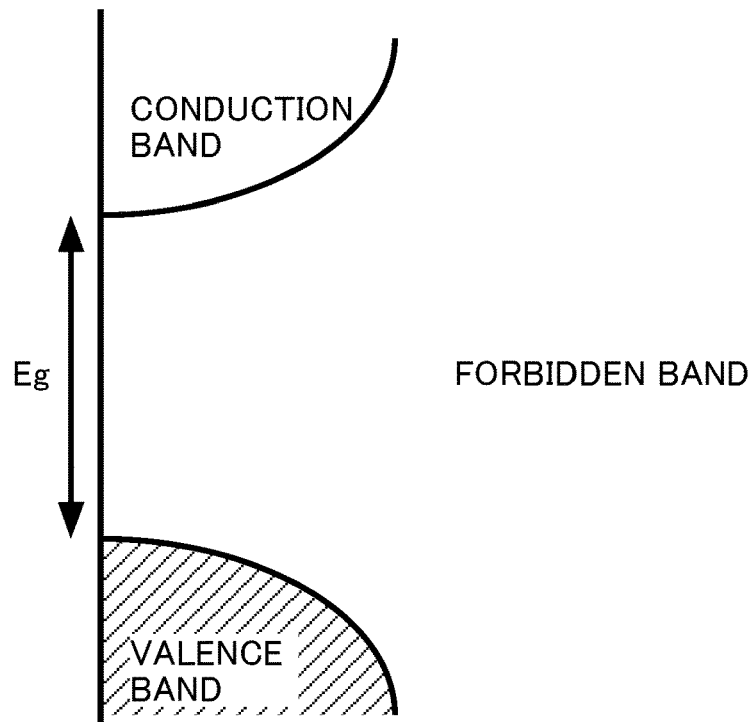
FIGS. 18A and 18B are diagrams illustrating a function and an effect of a method for manufacturing a semiconductor device according to the first embodiment.
Figure 18B:
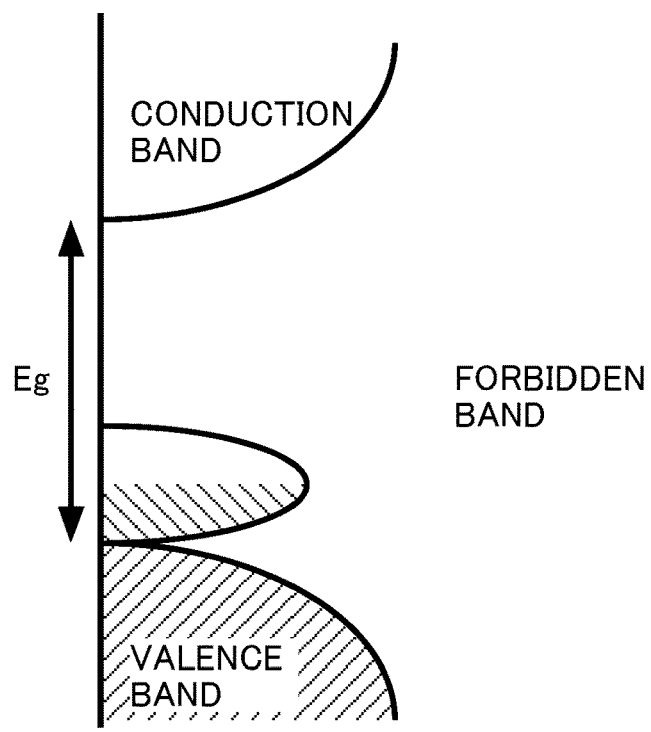

FIGS. 18A and 18B are explanatory diagrams in a case where the metal element (M) enters the interstitial site of the crystal structure of the silicon carbide. FIG. 18A illustrates a case where the metal element (M) is not present in the silicon carbide layer, and FIG. 18B illustrates a case where the metal element (M) is present in the silicon carbide layer.

As illustrated in FIG. 18B, in a case where the metal element (M) enters the interstitial site of the crystal structure of the silicon carbide, an acceptor level due to the metal element (M) is formed at an upper end of a valence band, electrons are supplied to the acceptor level, and holes are formed at the valence band. The metal element (M) functions as an acceptor.

From the calculation result described above, the reason why the contact resistance between the n-type silicon carbide region and the metal silicide layer decreases as the temperature of the silicidation annealing increases is considered as below. That is, when the temperature of the silicidation annealing is high, the metal element diffused from the metal film into the n-type silicon carbide region at the time of forming the metal silicide layer enters the carbon site in the crystal structure of the silicon carbide and becomes a donor. Therefore, the donor concentration of the n-type silicon carbide region increases. Accordingly, a Schottky barrier between the n-type silicon carbide region and the metal silicide layer is lowered, a tunnel current easily flows, and the contact resistance decreases.

From the calculation result described above, the reason why the contact resistance between the p-type silicon carbide region and the metal silicide layer increases as the temperature of the silicidation annealing increases is considered as below. That is, when the temperature of the silicidation annealing is high, the metal element diffused from the metal film into the p-type silicon carbide region at the time of forming the metal silicide layer enters the carbon site in the crystal structure of the silicon carbide and becomes a donor. For this reason, the acceptor concentration of the p-type silicon carbide region is offset and becomes low. Accordingly, the Schottky barrier between the p-type silicon carbide region and the metal silicide layer rises, the tunnel current hardly flows, and the contact resistance increases.

In the method for manufacturing the contact structure 100 of the first embodiment, when the p-type high-concentration region 17 is formed, carbon (C) is ion-implanted in addition to the ion implantation of aluminum (Al). Due to the ion implantation of the carbon (C), a large amount of excessive interstitial carbons are present in the p-type high-concentration region 17. Due to the heat treatment performed after the ion implantation of the carbon, the carbon vacancies generated by the ion implantation of aluminum are filled with the excessive interstitial carbons. Therefore, the amount of carbon vacancies in the p-type high-concentration region 17 is reduced. Therefore, the metal element (M) of the p-type high-concentration region 17 easily enters the interstitial site of the crystal structure of the silicon carbide. Accordingly, the acceptor concentration of the p-type high-concentration region 17 increases.

From the viewpoint of reducing the amount of carbon vacancies in the p-type high-concentration region 17, the second dose amount of carbon is preferably equal to or greater than 10 times the first dose amount of aluminum.

From the viewpoint of reducing the amount of carbon vacancies in the p-type high-concentration region 17, the second projected range Rp2 of the ion implantation of carbon is preferably equal to or greater than 80% and equal to or less than 120% of the first projected range Rp1 of the ion implantation of aluminum, and more preferably equal to or greater than 90% and equal to or less than 110% of the first projected range Rp1 of the ion implantation of aluminum.

When the first projected range Rp1 and the second projected range Rp2 are brought close to each other, the concentration distribution of carbon after the ion implantation completely and easily cover the concentration distribution of aluminum after the ion implantation. When the concentration distribution of carbon after the ion implantation completely covers the concentration distribution of aluminum after the ion implantation, the amount of carbon vacancies in the p-type high-concentration region 17 is reduced.

Figure 19:
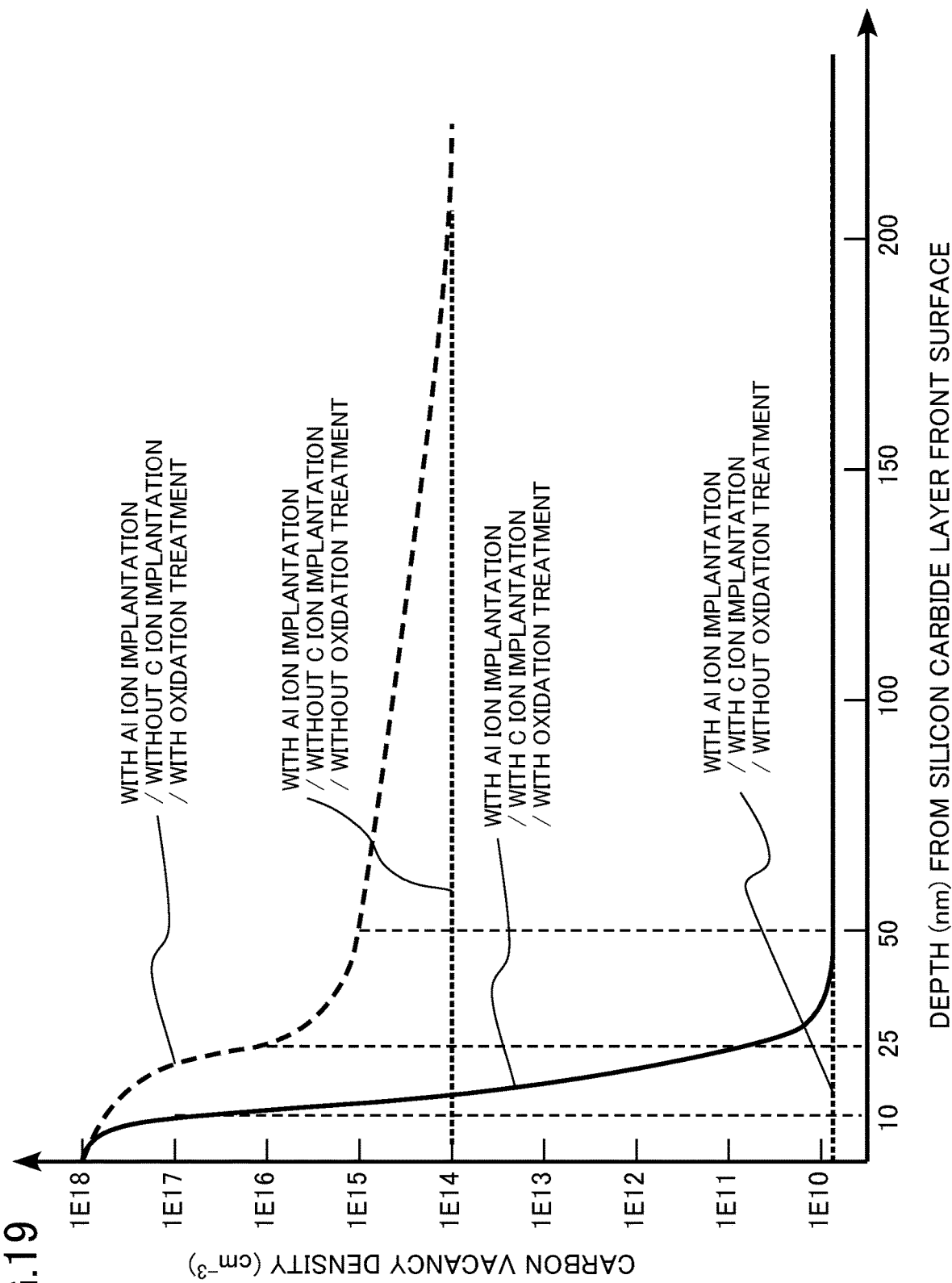
FIG. 19 is an explanatory diagram of a function and an effect of a method for manufacturing a semiconductor device according to the first embodiment.

FIG. 19 is an explanatory diagram of a function and an effect of the method for manufacturing a semiconductor device according to the first embodiment. FIG. 19 is a diagram illustrating a relationship between the depth from a silicon carbide layer surface and a carbon vacancy density.

As illustrated in FIG. 19, in a case where ion implantation of carbon is performed in addition to the ion implantation of aluminum, the carbon vacancy density can be kept low at equal to or less than $1E11$ cm$^{-3}$ when the silicon carbide layer is not subjected to the oxidation treatment. However, in a case where the oxidation treatment is performed after the ion implantation, for example, the carbon vacancy density increases up to a region of 25 nm from the silicon carbide layer surface. It is considered that the reason why the carbon vacancy density increases is that the carbon vacancies are generated due to a distortion generated on the silicon carbide layer surface by the oxidation treatment.

As illustrated in FIG. 19, in a case where the ion implantation of carbon is not performed in addition to the ion implantation of aluminum, when the oxidation treatment is performed after the ion implantation, for example, the carbon vacancy density increases up to a region of 200 nm from the silicon carbide layer surface. In a case where the ion implantation of carbon is not performed, ion implantation damage of aluminum remains, and the carbon vacancy density of the silicon carbide layer before the oxidation treatment is as high as about $1E14$ cm$^{-3}$. Therefore, diffusion of oxygen through the carbon vacancies is promoted, and the distortion of silicon carbide occurs up to a deep region of the silicon carbide layer.

In the method for manufacturing the contact structure 100 according to the first embodiment, after the silicon carbide layer 10 is subjected to the oxidation treatment, the surface of the silicon carbide layer 10 is etched by the hydrogen etching treatment. The oxidation treatment is, for example, an ashing treatment using oxygen plasma for removing the carbon film 60, and a thermal oxidation treatment for forming the sacrificial oxide film 62. In particular, it is difficult to omit the ashing treatment using oxygen plasma for removing the carbon film 60 from the viewpoint of suppressing desorption of silicon and carbon from the silicon carbide layer 10 into the atmosphere during the first heat treatment.

The hydrogen etching treatment removes a region having a high carbon vacancy density, and thus the carbon vacancy density on the surface of the silicon carbide layer is reduced. Therefore, the amount of carbon vacancies in the p-type high-concentration region 17 immediately below the nickel silicide layer is reduced.

Therefore, when the nickel silicide layer is formed, the metal element (M) of the p-type high-concentration region 17 easily enters the interstitial site of the crystal structure of the silicon carbide. Accordingly, the acceptor concentration of the p-type high-concentration region 17 increases.

From the viewpoint of reducing the carbon vacancy density of the surface of the silicon carbide layer 10, the etching amount of the surface of the silicon carbide layer at the time of the hydrogen etching treatment is preferably equal to or greater than 25 nm.

From the viewpoint of increasing the acceptor concentration of the p-type high-concentration region 17, the temperature of the silicidation annealing is preferably lower than 900° C.

According to the method for manufacturing the contact structure 100 of the first embodiment, the contact resistance between the p-type high-concentration region 17 and the contact electrode 11 decreases.

It is also possible to remove the nickel silicide layer after forming the nickel silicide layer and before forming the aluminum film 51. In this case, the aluminum film 51 is in contact with the p-type high-concentration region 17.

In the method for manufacturing the contact structure 100 of the first embodiment, the acceptor concentration of the p-type high-concentration region 17 can be increased. Therefore, even in a case where the aluminum film 51 is in contact with the p-type high-concentration region 17, the contact resistance between the p-type high-concentration region 17 and the contact electrode 11 can be reduced.

As described above, according to the first embodiment, it is possible to realize a semiconductor device capable of reducing the contact resistance between the silicon carbide layer and the metal electrode.

Second Embodiment

A method for manufacturing a semiconductor device according the second embodiment includes: performing first ion implantation of ion-implanting a p-type impurity into a first region of a silicon carbide layer; performing second ion implantation of ion-implanting carbon (C) into the first region; performing a third ion implantation of ion-implanting an n-type impurity into a second region of the silicon carbide layer; performing a first heat treatment for activating the n-type impurity and the p-type impurity; forming a gate insulating layer on the silicon carbide layer; forming a gate electrode on the gate insulating layer; performing an etching treatment of etching at least the first region in an atmosphere containing hydrogen gas after the gate electrode is formed; forming, on the first region and the second region, a first metal film containing at least one metal element selected from a group consisting of nickel (Ni), palladium (Pd), platinum (Pt), and chromium (Cr); performing a second heat treatment for causing the first region and second region to react with the first metal film to form a metal silicide layer containing the at least one metal element; and forming, on the first region and the second region, a second metal film having a chemical composition different from a chemical composition of the first metal film. The method for manufacturing a semiconductor device according to the second embodiment is different from that of the first embodiment in that an n-type impurity is ion-implanted into a second region of the silicon carbide layer to form a metal silicide layer in the second region. Hereinafter, description of the contents overlapping with the first embodiment may be partially omitted.

A semiconductor device according to the second embodiment includes: a silicon carbide layer including a p-type first silicon carbide region containing at least one metal element selected from the group consisting of nickel (Ni), palladium (Pd), platinum (Pt), and chromium (Cr) and an n-type second silicon carbide region containing a metal element; and a metal layer electrically connected to the first silicon carbide region and the second silicon carbide region. A ratio of intensity of infrared absorption at a wave number of 838 $cm^{-1}$ with respect to the intensity of the infrared absorption at a wave number of 970 $cm^{-1}$, which is measured by an attenuated total reflection method (ATR method) of a Fourier transform infrared spectroscopy method (FTIR method), is a first value in the vicinity of the surface of the first silicon carbide region, and the ratio is a second value greater than the first value in the vicinity of the surface of the second silicon carbide region.

Figure 20:
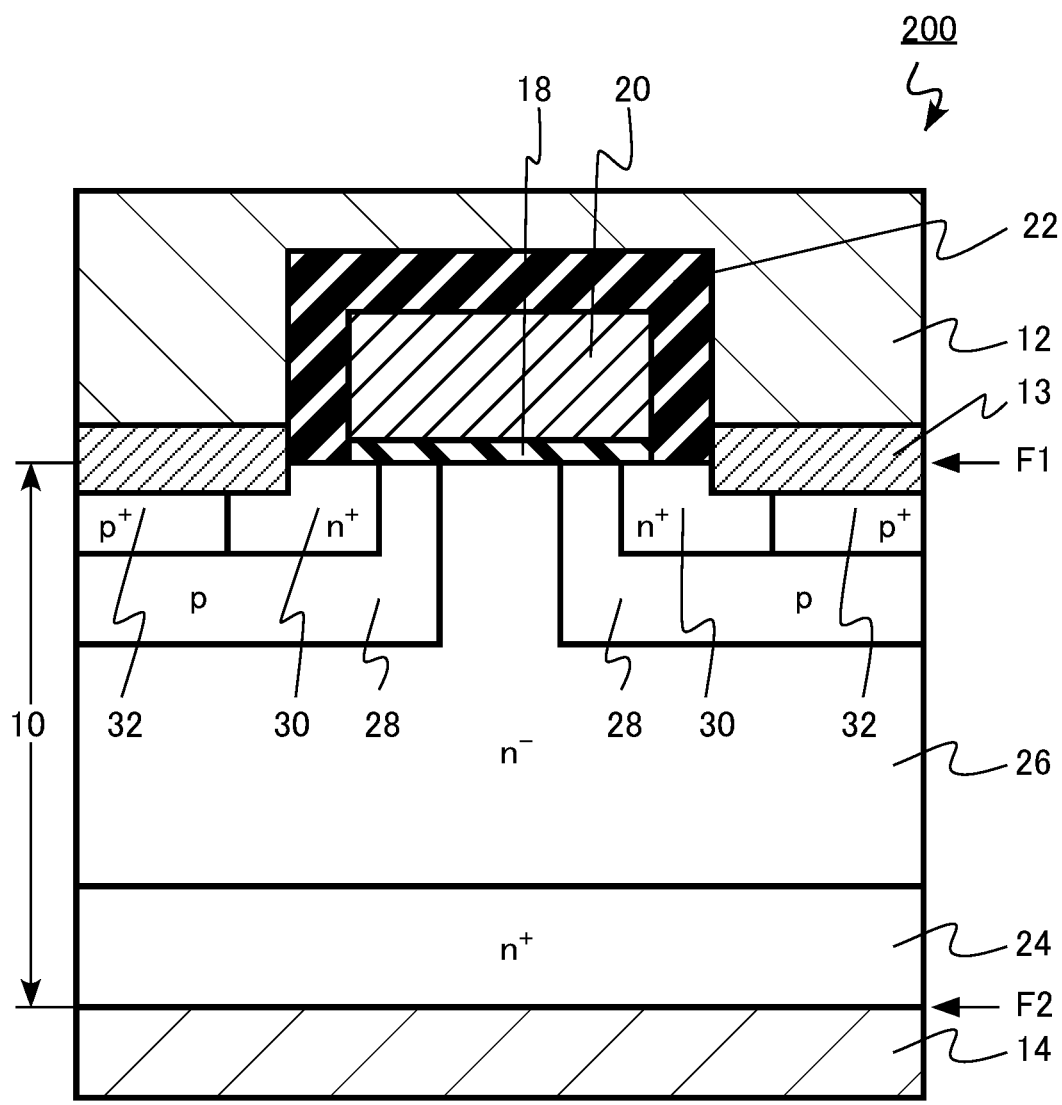
FIG. 20 is a schematic cross-sectional view of a semiconductor device according to a second embodiment.

FIG. 20 is a schematic cross-sectional view of the semiconductor device according to the second embodiment. The semiconductor device of the second embodiment is a vertical MOSFET 200. The MOSFET 200 is an n-channel transistor using electrons as a carrier.

The MOSFET 200 includes a silicon carbide layer 10, a source electrode 12 (metal layer), a metal silicide layer 13 (conductive layer), a drain electrode 14, a gate insulating layer 18, a gate electrode 20, and an interlayer insulating layer 22.

The source electrode 12 is an example of the metal layer. The metal silicide layer 13 is an example of the conductive layer.

The silicon carbide layer 10 includes a drain region 24, a drift region 26, a p-well region 28, a source region 30 (second silicon carbide region), and a p-well contact region 32 (first silicon carbide region).

The silicon carbide layer 10 is, for example, a single crystal of 4H—SiC. The silicon carbide layer 10 has a first surface F1 and a second surface F2. The second surface F2 is opposed to the first surface F1. The first surface F1 is a surface of the silicon carbide layer 10, and the second surface F2 is a back surface of the silicon carbide layer 10.

In the second embodiment, a "depth" means a depth with respect to the first surface F1. Here, the first surface F1 is a virtual plane surface including an interface between the silicon carbide layer 10 and the gate insulating layer 18.

Hereinafter, a case where the first surface F1 of the silicon carbide layer 10 is a surface inclined at equal to or greater than zero degrees and equal to or less than ten degrees with respect to a silicon face, and the second surface F2 is a surface inclined at equal to or greater than zero degrees and equal to or less than ten degrees with respect to a carbon face will be described as an example. The first surface F1 of the silicon carbide layer has an off angle of equal to or greater than zero degrees and equal to or less than ten degrees with respect to the silicon face.

The drain region 24 is $n^+$-type SiC. The drain region 24 contains, for example, nitrogen (N) as an n-type impurity. The n-type impurity concentration of the drain region 24 is, for example, equal to or greater than $1 \times 10^{18}$ $cm^{-3}$ and equal to or less than $1 \times 10^{21}$ $cm^{-3}$.

The drift region 26 is $n^-$-type SiC. The drift region 26 is located between the drain region 24 and the first surface F1. A part of the drift region 26 is in contact with the first surface F1.

The drift region 26 contains, for example, nitrogen (N) as an n-type impurity. The n-type impurity concentration of the drift region 26 is, for example, equal to or greater than $1 \times 10^{15}$ $cm^{-3}$ and equal to or less than $2 \times 10^{16}$ $cm^{-3}$. The n-type impurity concentration of the drift region 26 is lower than the n-type impurity concentration of the drain region 24.

The drift region 26 is, for example, a Sic epitaxial growth layer formed on the drain region 24 by epitaxial growth. The thickness of the drift region 26 is, for example, equal to or greater than 5 μm and equal to or less than 100 μm.

The p-well region 28 is p-type SiC. The p-well region 28 is located between the drift region 26 and the first surface F1. A part of the p-well region 28 is in contact with the first surface F1.

The p-well region 28 contains, for example, aluminum (Al) as a p-type impurity. The p-type impurity concentration of the p-well region 28 is, for example, equal to or greater than $1 \times 10^{16}$ $cm^{-3}$ and equal to or less than $1 \times 10^{20}$ $cm^{-2}$.

The depth of the p-well region 28 is, for example, equal to or greater than 0.4 μm and equal to or less than 0.8 μm. The p-well region 28 functions as a channel region of the MOSFET 200.

The source region 30 is $n^+$-type SiC. The source region 30 is located between the p-well region 28 and the first surface F1. A part of the source region 30 is in contact with the first surface F1. The source region 30 extends in a first direction.

The source region 30 contains phosphorus (P) or nitrogen (N) as an n-type impurity. The n-type impurity concentration of the source region 30 is, for example, equal to or greater than $1 \times 10^{18}$ $cm^{-3}$ and equal to or less than $1 \times 10^{22}$ $cm^{-2}$. The n-type impurity concentration of the source region 30 is higher than the n-type impurity concentration of the drift region 26.

The depth of the source region 30 is smaller than the depth of the p-well region 28. The depth of the source region 30 is, for example, equal to or greater than 0.1 μm and equal to or less than 0.4 μm.

The source region 30 contains at least one metal element (M) selected from the group consisting of nickel (Ni), palladium (Pd), platinum (Pt), and chromium (Cr). The concentration of the metal element (M) of the source region 30 is, for example, equal to or greater than $1 \times 10^{18}$ $cm^{-3}$ and equal to or less than $1 \times 10^{21}$ $cm^{-3}$.

Among the metal elements (M) contained in the source region 30, a ratio of the metal element (M) located at the carbon site in the crystal structure of the silicon carbide is higher than a ratio of the metal element (M) located at the interstitial site of the crystal structure of the silicon carbide. It is preferable that 90% or greater of the metal elements (M) contained in the source region 30 is located at the carbon site in the crystal structure of the silicon carbide. It is possible to realize the structure described above by devising to increase the number of carbon vacancies.

The p-well contact region 32 is p$^+$-type SiC. The p-well contact region 32 is located between the p-well region 28 and the first surface F1. The p-well contact region 32 is adjacent to the source region 30. The p-well contact region 32 is in contact with the source region 30.

The p-well contact region 32 contains, for example, aluminum as a p-type impurity. The p-type impurity concentration of the p-well contact region 32 is, for example, equal to or greater than $1 \times 10^{18}$ cm$^{-3}$ and equal to or less than $1 \times 10^{22}$ cm$^{-3}$. The p-type impurity concentration of the p-well contact region 32 is higher than the p-type impurity concentration of the p-well region 28.

The depth of the p-well contact region 32 is smaller than the depth of the p-well region 28. The depth of the p-well contact region 32 is, for example, equal to or greater than 0.1 µm and equal to or less than 0.4 µm.

The p-well contact region 32 contains at least one metal element (M) selected from the group consisting of nickel (Ni), palladium (Pd), platinum (Pt), and chromium (Cr). The concentration of the metal element (M) of the p-well contact region 32 is, for example, equal to or greater than $1 \times 10^{10}$ cm$^{-3}$ and equal to or less than $1 \times 10^{21}$ cm$^{-3}$.

Among the metal elements (M) contained in the p-well contact region 32, a ratio of the metal element (M) located at the interstitial site of the crystal structure of the silicon carbide is higher than a ratio of the metal element (M) located at the carbon site in the crystal structure of the silicon carbide. It is preferable that 90% or greater of the metal elements (M) contained in the p-well contact region 32 is located at the interstitial site of the crystal structure of the silicon carbide. It is possible to realize the structure described above by devising to decrease the number of carbon vacancies.

A ratio of intensity of infrared absorption at a wave number of 838 cm$^{-1}$ with respect to the intensity of the infrared absorption at a wave number of 970 cm$^{-1}$, which is measured by an attenuated total reflection method (ATR method) of a Fourier transform infrared spectroscopy method (FTIR method), is a first value in the vicinity of the surface of the p-well contact region 32. The ratio of intensity of infrared absorption at a wave number of 838 cm$^{-1}$ with respect to the intensity of the infrared absorption at a wave number of 970 cm$^{-1}$, which is measured by an attenuated total reflection method (ATR method) of a Fourier transform infrared spectroscopy method (FTIR method), is a second value in the vicinity of the surface of the source region 30.

The second value is higher than the first value. The second value is, for example, equal to or greater than two times the first value.

The gate insulating layer 18 is located between the silicon carbide layer 10 and the gate electrode 20. The gate insulating layer 18 is located between the p-well region 28 and the gate electrode 20.

The gate insulating layer 18 is formed of, for example, an oxide or an oxynitride. The gate insulating layer 18 is formed of, for example, silicon oxide. The thickness of the gate insulating layer 18 is, for example, equal to or greater than 30 nm and equal to or less than 100 nm.

The gate insulating layer 18 and the p-well region 28 are in contact with each other. The p-well region 28 in the vicinity of the gate insulating layer 18 is the channel region of the MOSFET 200.

The gate electrode 20 is located on the first surface F1 side of the silicon carbide layer 10. The gate electrode 20 is provided on the gate insulating layer 18. The gate electrode 20 sandwiches the gate insulating layer 18 with the drift region 26, the source region 30, and the p-well region 28.

The gate electrode 20 is formed of a conductor. The gate electrode 20 is formed of, for example, polycrystalline silicon containing an n-type impurity or a p-type impurity. The gate electrode 20 may be formed of, for example, metal such as titanium nitride, tungsten nitride, tungsten, aluminum, copper, ruthenium, cobalt, nickel, cobalt silicide, or nickel silicide. The gate electrode 20 may have a stacked structure obtained by stacking any one of the above-described metals and the polycrystalline silicon containing the n-type impurity or the p-type impurity.

The interlayer insulating layer 22 is provided on the gate electrode 20. The interlayer insulating layer 22 electrically isolates the gate electrode 20 from the source electrode 12. The interlayer insulating layer 22 is formed of, for example, silicon oxide.

The source electrode 12 is located on the first surface F1 side of the silicon carbide layer 10. The source electrode 12 is electrically connected to the source region 30 and the p-well contact region 32. The source electrode 12 also functions as a p-well electrode that applies an electric potential to the p-well region 28. The source electrode 12 is in contact with the metal silicide layer 13.

The source electrode 12 contains metal. The source electrode 12 is formed of, for example, aluminum, an aluminum alloy, tungsten, or copper.

For example, a barrier metal film (not illustrated) may be provided between the source electrode 12 and the metal silicide layer 13. The barrier metal film is formed of, for example, titanium or titanium nitride.

The metal silicide layer 13 is provided between the silicon carbide layer 10 and the source electrode 12. The metal silicide layer 13 is an example of the conductive layer. The metal silicide layer 13 is in contact with the silicon carbide layer 10. The metal silicide layer 13 is in contact with the source electrode 12.

The metal silicide layer 13 contains, for example, silicide of at least one metal element (M) selected from the group consisting of nickel (Ni), palladium (Pd), platinum (Pt), and chromium (Cr). The metal silicide layer 13 contains, for example, nickel silicide, palladium silicide, platinum silicide, or chromium silicide. The metal silicide layer 13 is formed of, for example, nickel silicide, palladium silicide, platinum silicide, or chromium silicide.

The thickness of the metal silicide layer 13 in a normal direction of the first surface F1 of the silicon carbide layer 10 is, for example, equal to or greater than 50 nm and equal to or less than 500 nm.

The drain electrode 14 is located on the second surface F2 side of the silicon carbide layer 10. The drain electrode 14 is in contact with the drain region 24. The drain electrode 14 is electrically connected to the drain region 24.

The drain electrode 14 is formed of, for example, nickel. The nickel may react with the silicon carbide layer 10 to form nickel silicide. The nickel silicide is, for example, NiSi or Ni$_2$Si.

Next, an example of the method for manufacturing a semiconductor device according to the second embodiment will be described.

FIGS. 21, 22, 23, 24, 25, 26, 27, 28, 29, 30, 31, 32, 33, 34, 35, 36, 37, 38, 39, 40, 41, and 42 are schematic cross-sectional views illustrating the method for manufacturing a semiconductor device of the second embodiment. FIGS. 21 to 42 are cross sections corresponding to FIG. 20.

Figure 21:
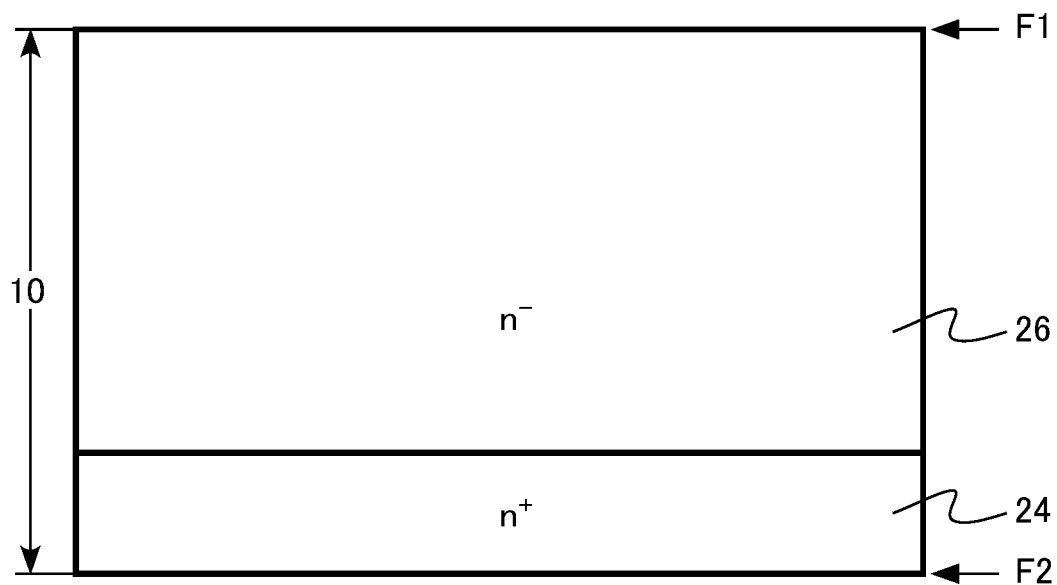
FIG. 21 is a schematic cross-sectional view illustrating a method for manufacturing a semiconductor device according to the second embodiment.

First, the silicon carbide layer 10 is prepared (FIG. 21). The silicon carbide layer 10 includes an $n^+$-type drain region 24 and an $n^-$-type drift region 26. For example, the drift region 26 is formed on the $n^-$-type drain region 24 by an epitaxial growth method. The silicon carbide layer 10 has a first surface F1 and a second surface F2.

Figure 22:
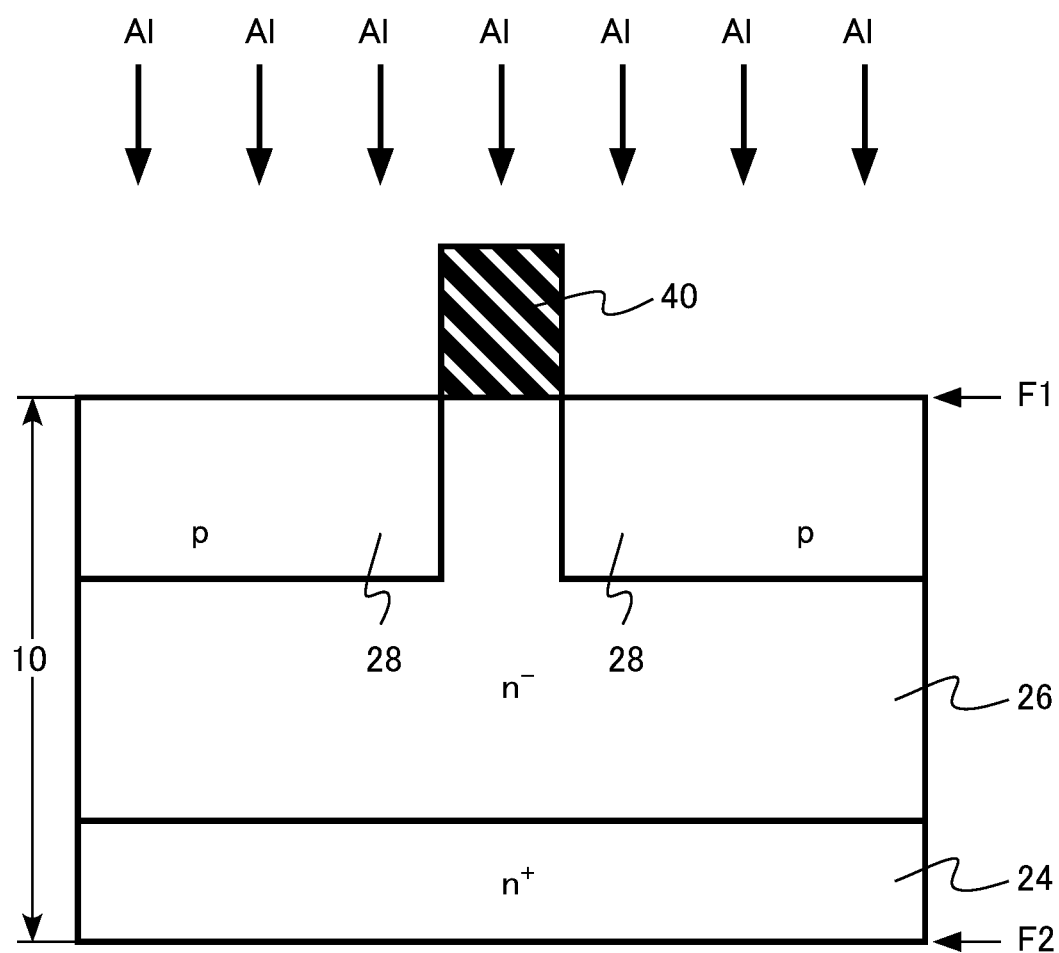
FIG. 22 is a schematic cross-sectional view illustrating a method for manufacturing a semiconductor device according to the second embodiment.

Next, a first mask material 40 formed of silicon oxide is formed by patterning by photolithography and etching. Next, by using the first mask material 40 as an ion implantation mask, aluminum (Al) as a p-type impurity is ion-implanted into the drift region 26 to form the p-well region 28 (FIG. 22).

Figure 23:
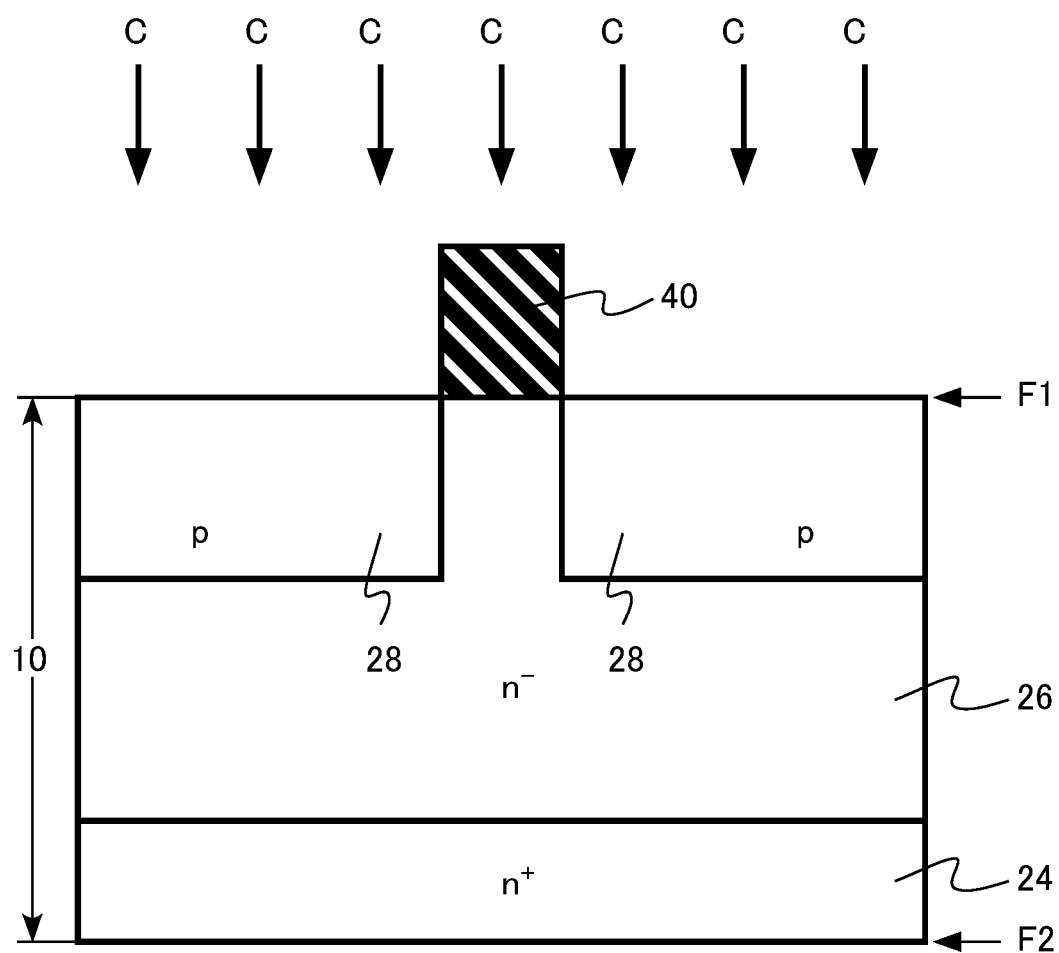
FIG. 23 is a schematic cross-sectional view illustrating a method for manufacturing a semiconductor device according to the second embodiment.

Next, carbon (C) is ion-implanted into the p-well region 28 by using the first mask material 40 as the ion implantation mask (FIG. 23). The ion implantation of carbon into the p-well region 28 reduces carbon vacancies in the p-well region 28. By the ion implantation of carbon, the carbon vacancies in the p-well region 28 are filled with carbon, and the carbon vacancies are reduced.

Figure 24:
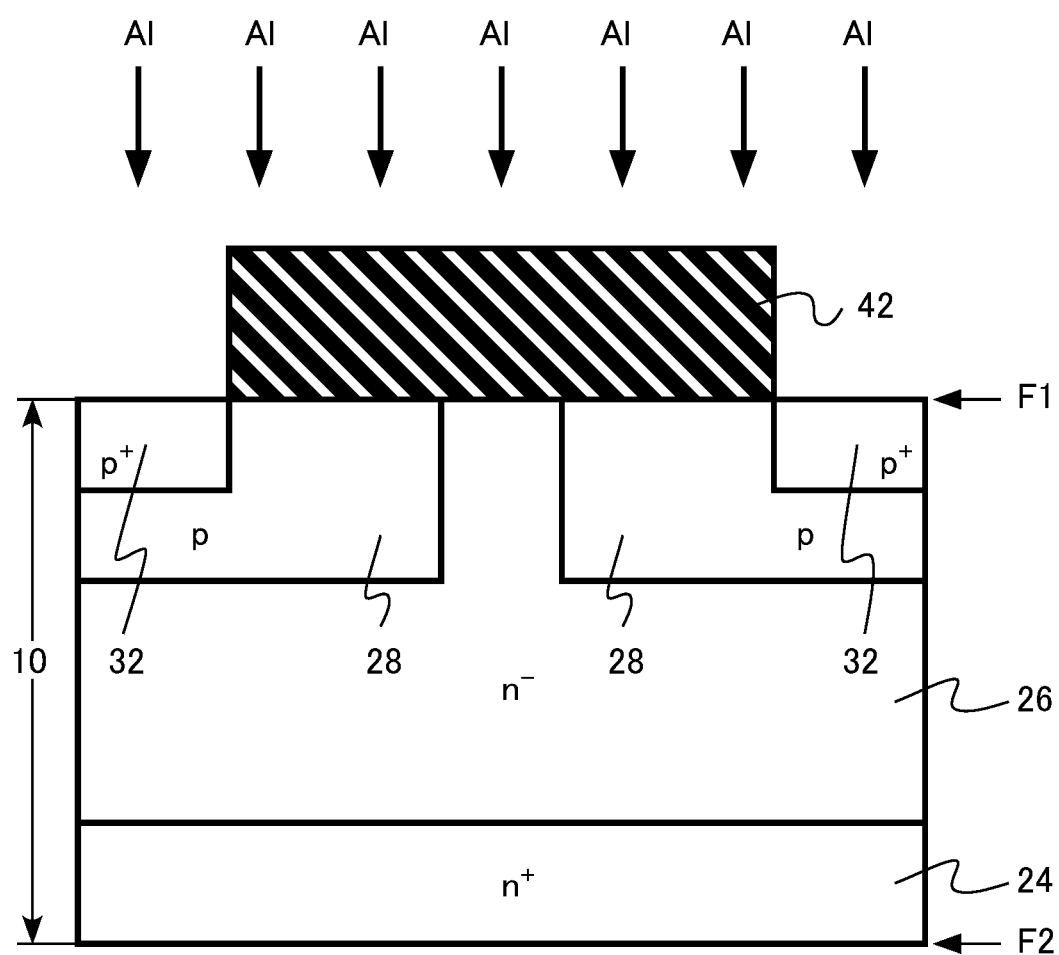
FIG. 24 is a schematic cross-sectional view illustrating a method for manufacturing a semiconductor device according to the second embodiment.

Next, a second mask material 42 formed of silicon oxide is formed by patterning by photolithography and etching. By using the second mask material 42 as an ion implantation mask, aluminum (Al) is ion-implanted into the p-well region 28 to form the p-well contact region 32 (FIG. 24).

A region in which the p-well contact region 32 is formed is an example of a first region. The ion implantation for forming the p-well contact region 32 is an example of the first ion implantation.

Figure 25:
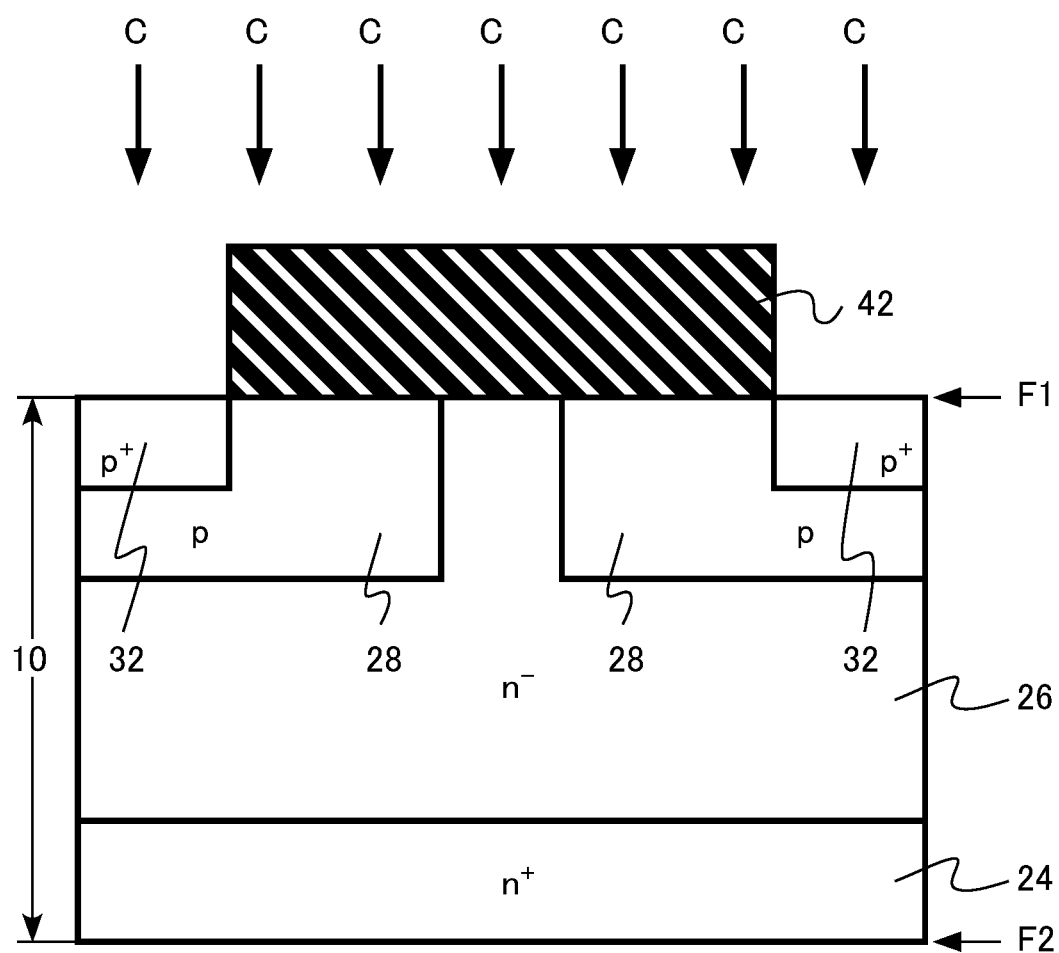
FIG. 25 is a schematic cross-sectional view illustrating a method for manufacturing a semiconductor device according to the second embodiment.

Next, carbon (C) is ion-implanted into the p-well contact region 32 by using the second mask material 42 as the ion implantation mask (FIG. 25). By the ion implantation of carbon into the p-well contact region 32, the carbon vacancies in a second region are reduced. By the ion implantation of carbon, the carbon vacancies in the p-well contact region 32 are filled with carbon, and the carbon vacancies are reduced.

The ion implantation of carbon into the p-well contact region 32 is an example of the second ion implantation.

Figure 26:
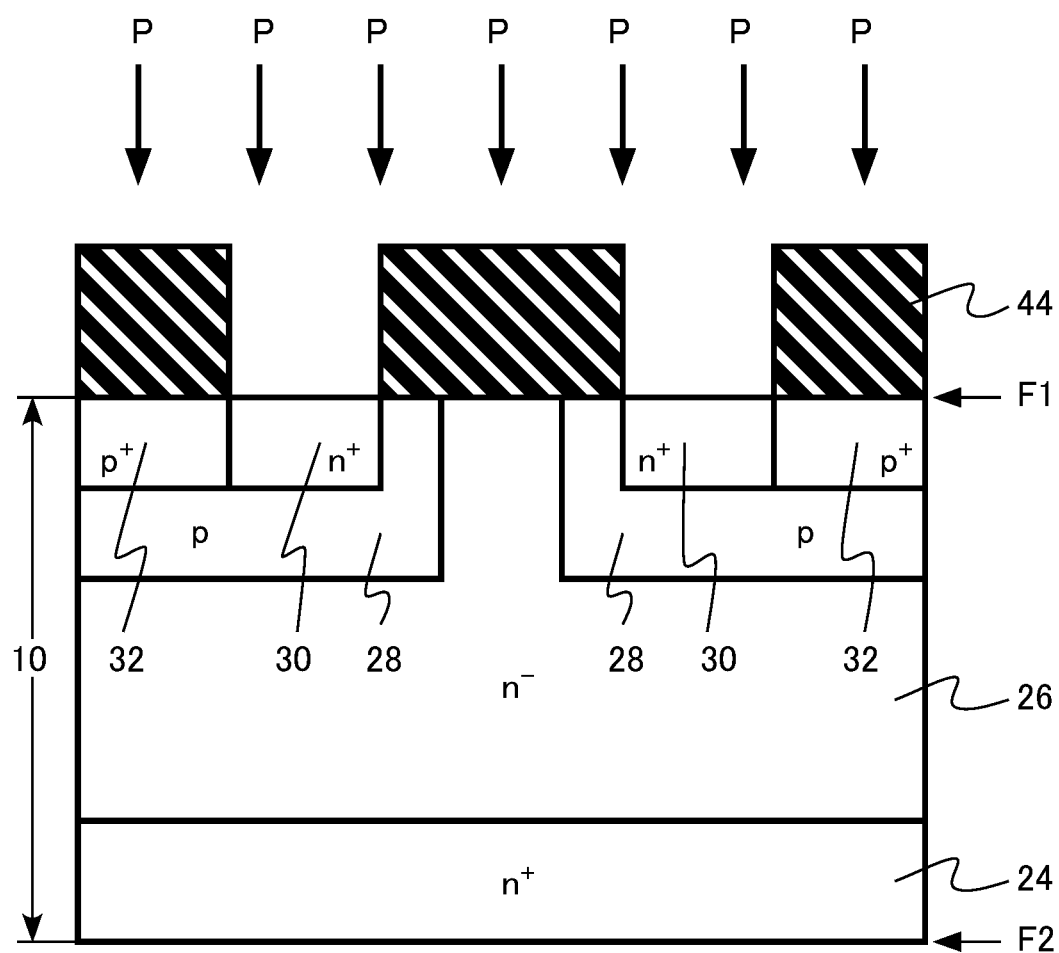
FIG. 26 is a schematic cross-sectional view illustrating a method for manufacturing a semiconductor device according to the second embodiment.

Next, a third mask material 44 formed of silicon oxide is formed by patterning by photolithography and etching. By using the third mask material 44 as an ion implantation mask, phosphorus (P) as an n-type impurity is ion-implanted into the p-well region 28 to form the source region 30 (FIG. 26).

A region in which the source region 30 is formed is an example of the second region. The ion implantation for forming the source region 30 is an example of the third ion implantation.

Figure 27:
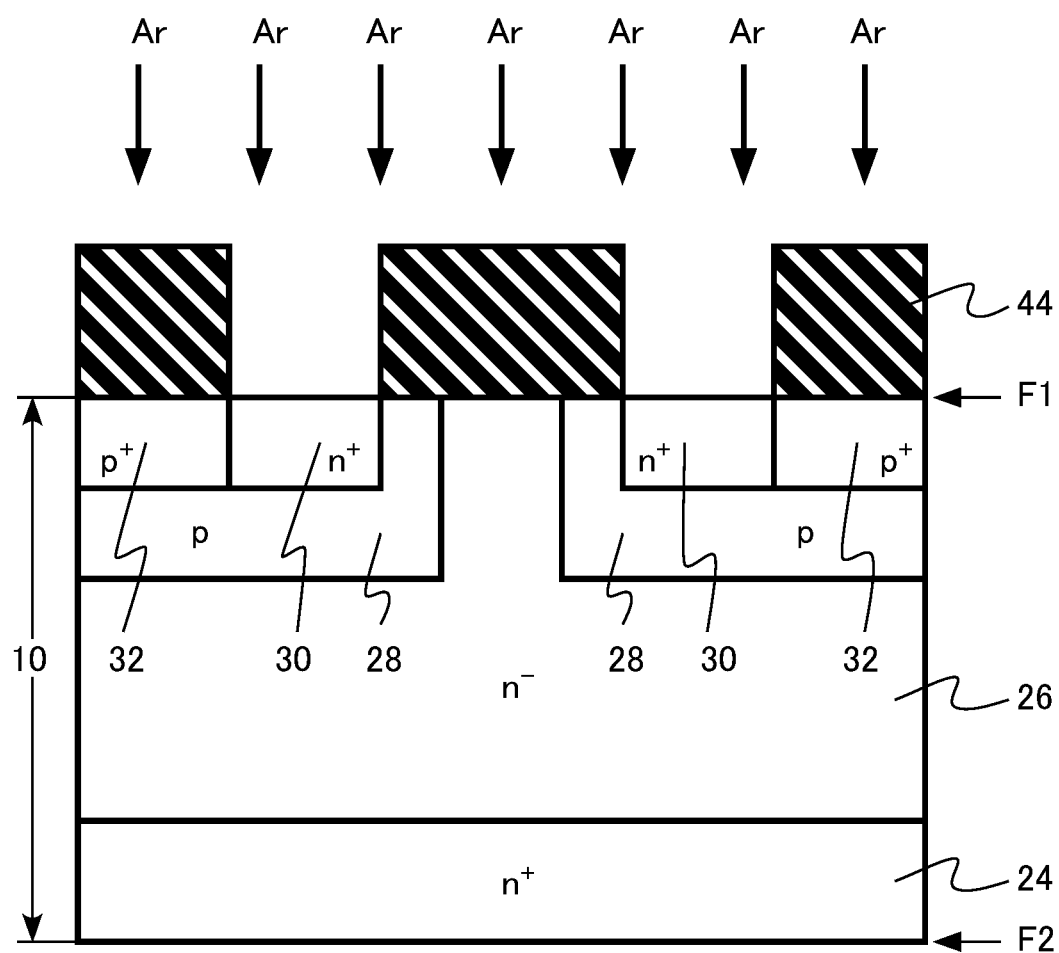
FIG. 27 is a schematic cross-sectional view illustrating a method for manufacturing a semiconductor device according to the second embodiment.

Next, argon (Ar) is ion-implanted into the source region 30 by using the third mask material 44 as the ion implantation mask (FIG. 27). The ion implantation of argon into the source region 30 increases carbon vacancies in the source region 30. By the ion implantation of argon, the bond with the silicon carbide in the source region 30 is broken, and the carbon vacancies in the source region 30 increase.

Figure 28:
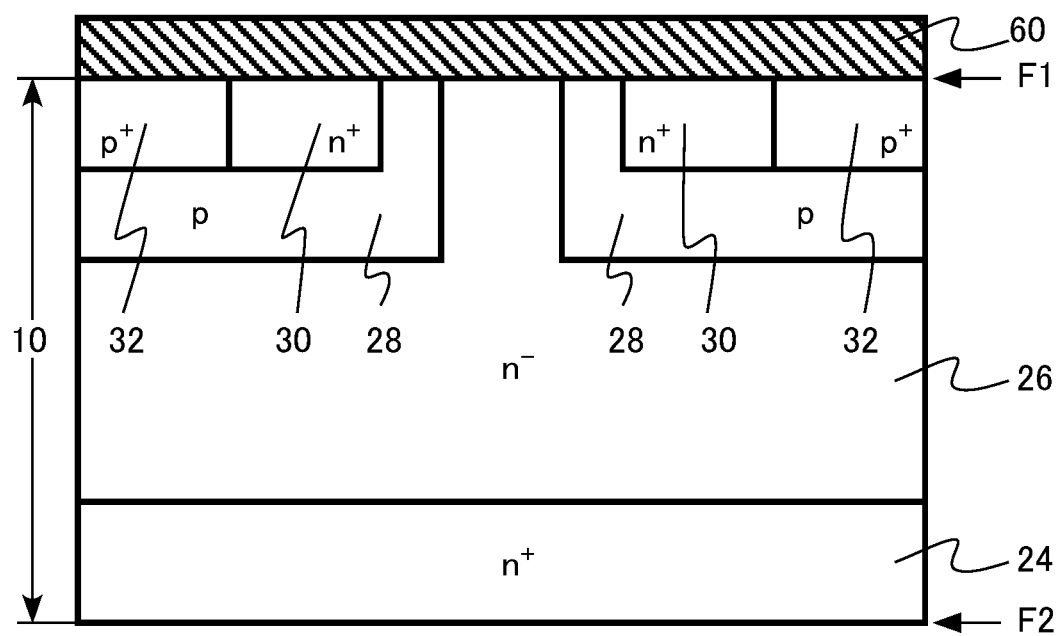
FIG. 28 is a schematic cross-sectional view illustrating a method for manufacturing a semiconductor device according to the second embodiment.

Next, the carbon film 60 is formed on the silicon carbide layer 10 (FIG. 28).

Next, the first heat treatment is performed. The first heat treatment is activation annealing for activating ion-implanted aluminum. The p-type impurities of the p-well region 28 and p-well contact region 32 and the n-type impurity of the source region 30 are activated.

The first heat treatment is performed, for example, at equal to or higher than 1600° C. The first heat treatment is performed, for example, at equal to or lower than 2000° C. The first heat treatment is performed in a non-oxidizing atmosphere. The first heat treatment is performed, for example, in an inert gas atmosphere. The first heat treatment is performed, for example, in an argon gas atmosphere.

By the first heat treatment, interstitial carbon formed by ion implantation of carbon into the silicon carbide layer 10 fills a carbon vacancy in the silicon carbide layer 10.

Figure 29:
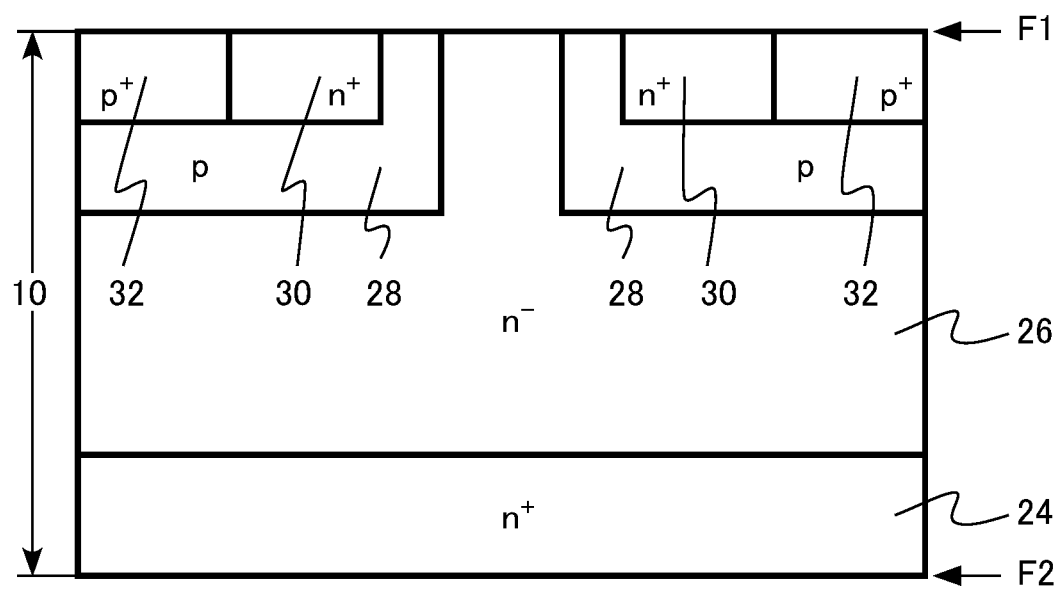
FIG. 29 is a schematic cross-sectional view illustrating a method for manufacturing a semiconductor device according to the second embodiment.

Next, the carbon film 60 is removed (FIG. 29). The carbon film 60 is removed by an ashing treatment using oxygen plasma. The carbon film 60 is removed in the oxygen plasma. During the ashing treatment using oxygen plasma, the surface of the silicon carbide layer 10 is oxidized. The ashing treatment using oxygen plasma is an example of the oxidation treatment.

Figure 30:
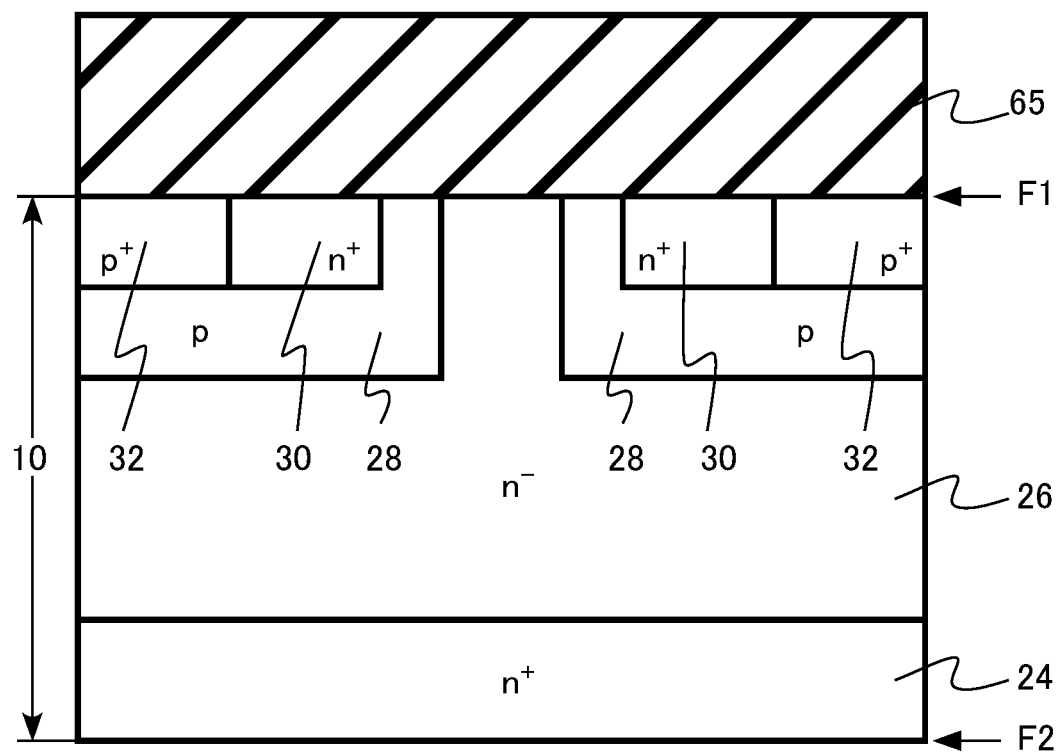
FIG. 30 is a schematic cross-sectional view illustrating a method for manufacturing a semiconductor device according to the second embodiment.

Next, a field oxide film 65 is formed on the silicon carbide layer 10 (FIG. 30). The field oxide film 65 contains oxygen. The field oxide film 65 is, for example, a silicon oxide film. The field oxide film 65 is deposited by, for example, a vapor phase growth method. The field oxide film 65 is formed by, for example, a CVD method or a physical vapor deposition method (PVD method).

When the field oxide film 65 is deposited, the surface of the silicon carbide layer 10 is oxidized. The deposition process of depositing the field oxide film 65 is an example of the oxidation treatment. The field oxide film 65 functions as, for example, an element isolation region in a peripheral region (not illustrated).

Next, the field oxide film 65 is removed. The field oxide film 65 is removed using, for example, a wet etching method.

Figure 31:
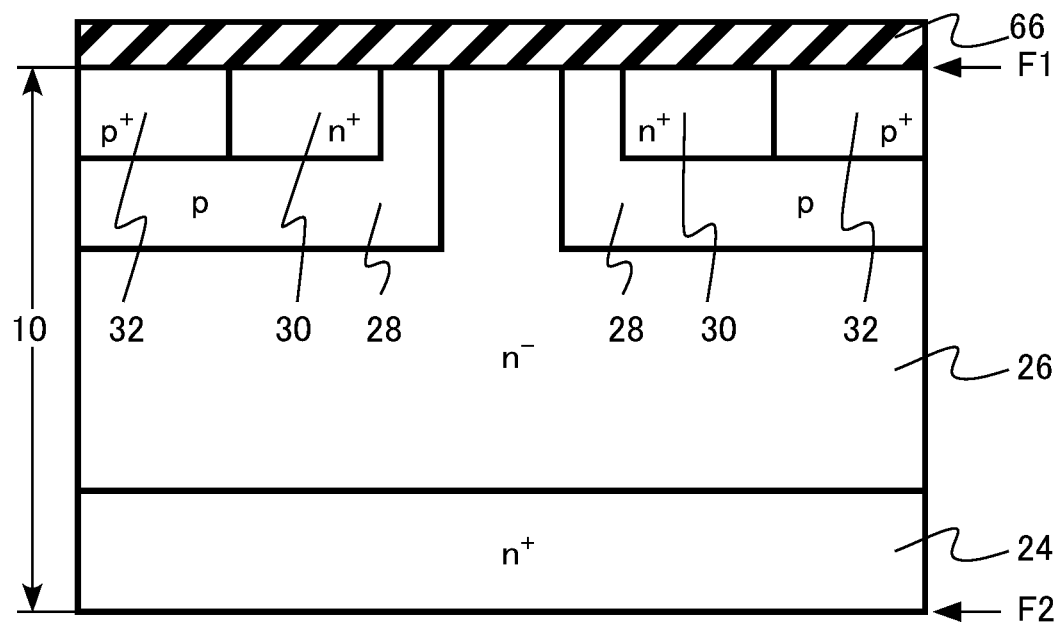
FIG. 31 is a schematic cross-sectional view illustrating a method for manufacturing a semiconductor device according to the second embodiment.

Next, a sacrificial oxide film 66 is formed on the silicon carbide layer 10 (FIG. 31). The sacrificial oxide film 66 is, for example, a silicon oxide film. The sacrificial oxide film 66 is formed by thermal oxidation of the surface of the silicon carbide layer 10.

When the sacrificial oxide film 66 is formed, the surface of the silicon carbide layer 10 is oxidized. The thermal oxidation treatment for forming the sacrificial oxide film 66 is an example of the oxidation treatment. By forming the sacrificial oxide film 66, for example, the impurity and damage on the surface of the silicon carbide layer 10 are removed.

Next, the sacrificial oxide film 66 is removed. The sacrificial oxide film 66 is removed using, for example, a wet etching method.

Next, the gate insulating layer 18 is formed on the silicon carbide layer 10 by a CVD method or a thermal oxidation method. The gate insulating layer 18 is formed of, for example, silicon oxide. When the gate insulating layer 18 is formed, the surface of the silicon carbide layer 10 is oxidized. The process of forming the gate insulating layer 18 is an example of the oxidation treatment.

Figure 32:
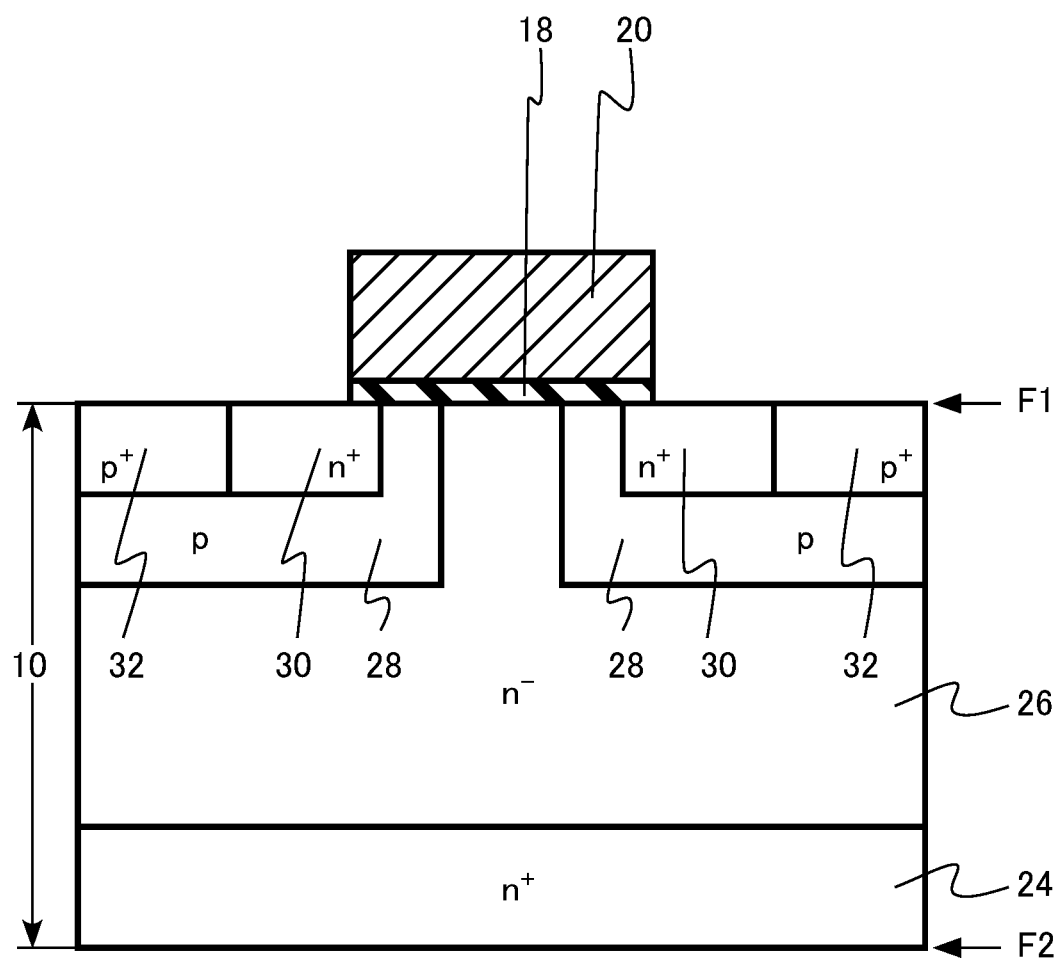
FIG. 32 is a schematic cross-sectional view illustrating a method for manufacturing a semiconductor device according to the second embodiment.

Next, the gate electrode 20 is formed on the gate insulating layer 18 (FIG. 32). The gate electrode 20 is formed of, for example, polycrystalline silicon. The gate electrode 20 is formed by, for example, deposition of a film by a CVD method and patterning by photolithography and etching.

Figure 33:
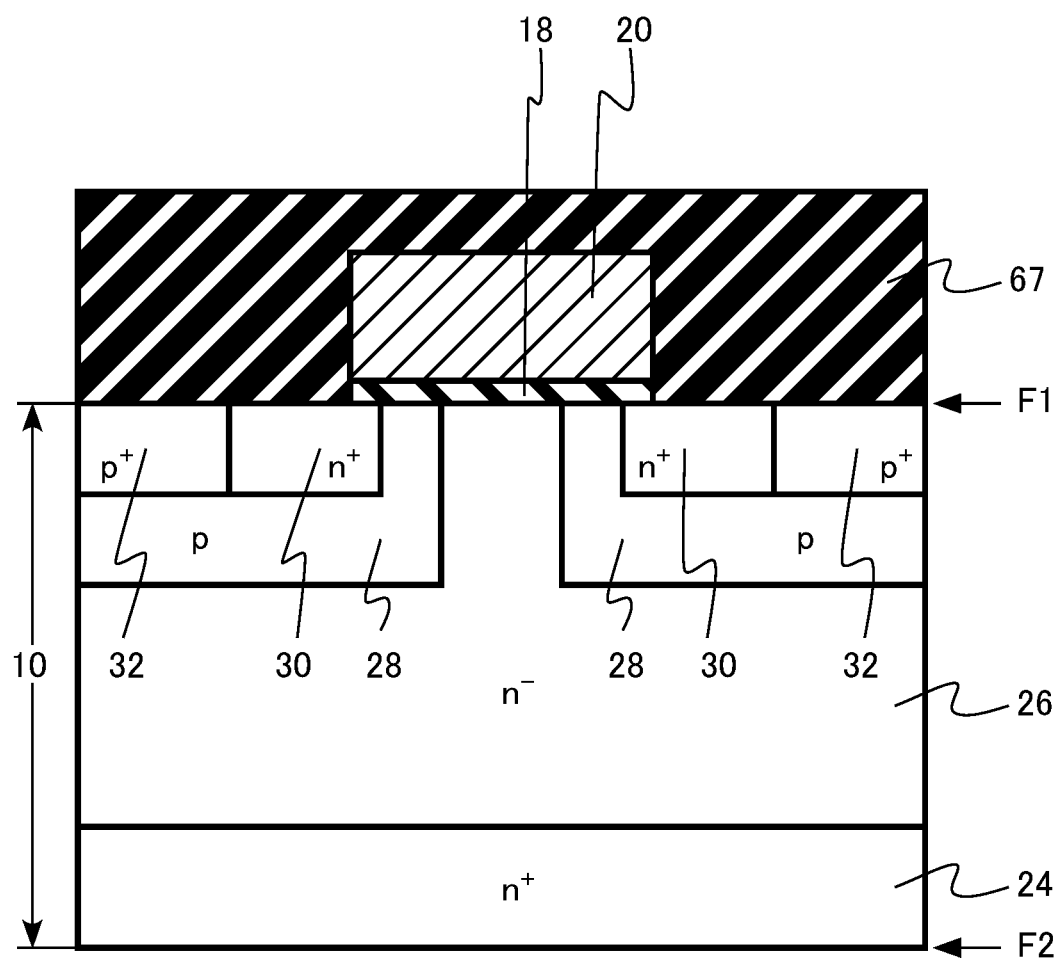
FIG. 33 is a schematic cross-sectional view illustrating a method for manufacturing a semiconductor device according to the second embodiment.

Next, an insulating layer 67 is formed on the gate electrode 20 (FIG. 33). A part of the insulating layer 67 finally becomes the interlayer insulating layer 22. The insulating layer 67 is formed of, for example, silicon oxide. The insulating layer 67 is formed by, for example, a CVD method.

Figure 34:
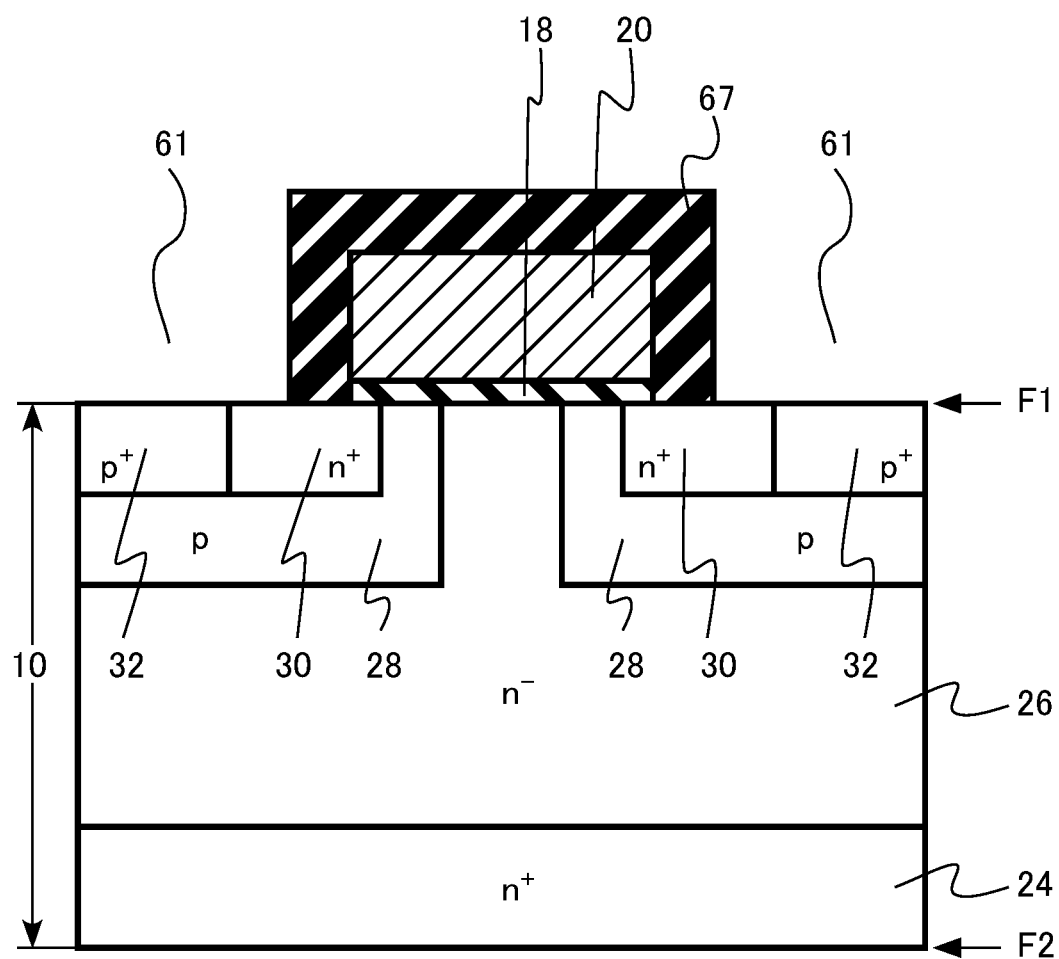
FIG. 34 is a schematic cross-sectional view illustrating a method for manufacturing a semiconductor device according to the second embodiment.

Next, the contact hole 61 is formed in the insulating layer 67 (FIG. 34). The contact hole 61 is an example of an opening. The silicon carbide layer 10 is exposed at the bottom portion of the contact hole 61. The p-well contact region 32 and the source region 30 are exposed at the bottom portion of the contact hole 61.

The contact hole 61 is formed by, for example, patterning by photolithography and etching.

Figure 35:
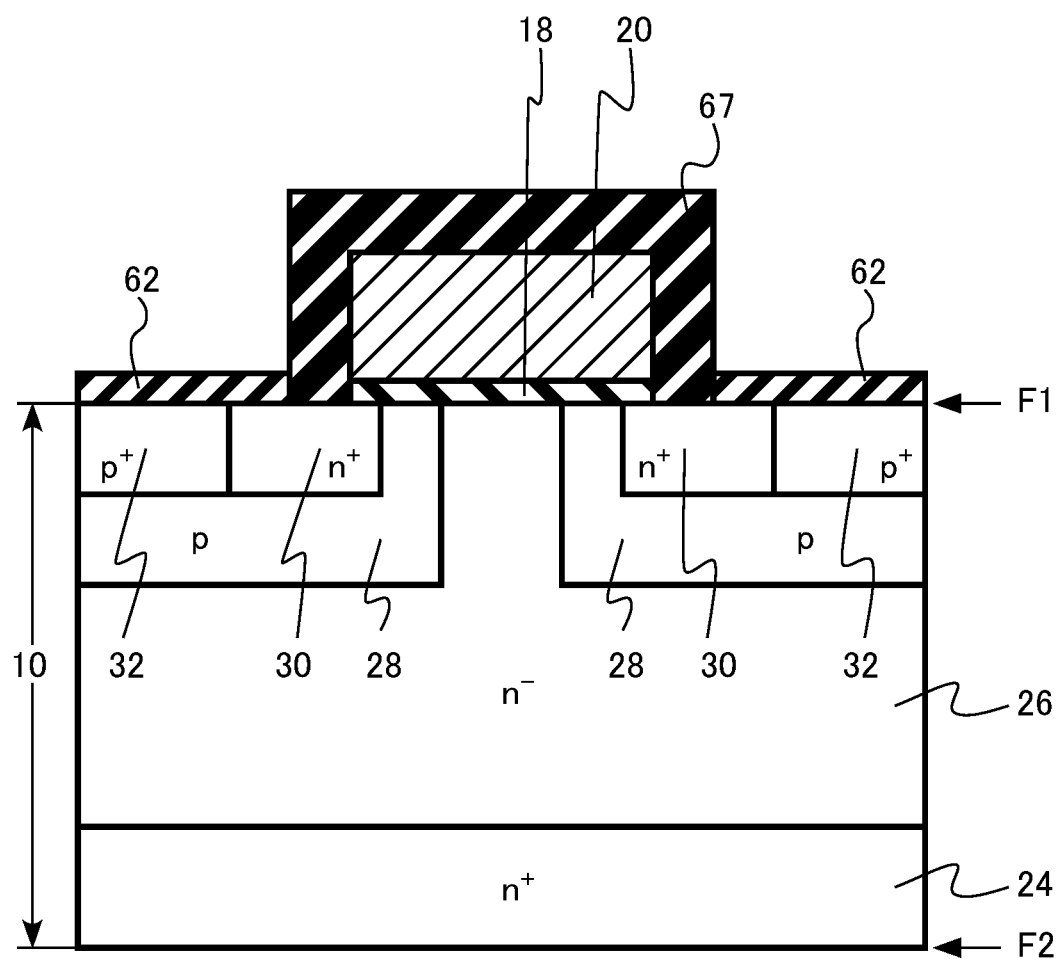
FIG. 35 is a schematic cross-sectional view illustrating a method for manufacturing a semiconductor device according to the second embodiment.

Next, the sacrificial oxidation of the silicon carbide layer 10 is performed. The sacrificial oxidation is thermal oxidation. A sacrificial oxide film 62 is formed on the silicon carbide layer 10 by sacrificial oxidation (FIG. 35). The sacrificial oxide film 62 is formed on the p-well contact region 32 and the source region 30. The sacrificial oxidation is an example of the oxidation treatment.

The sacrificial oxide film 62 is a silicon oxide film. By forming the sacrificial oxide film 62, for example, the impurity and damage on the surface of the silicon carbide layer 10 are removed.

Next, the sacrificial oxide film 62 is removed. The sacrificial oxide film 62 is removed using, for example, a wet etching method.

Figure 36:
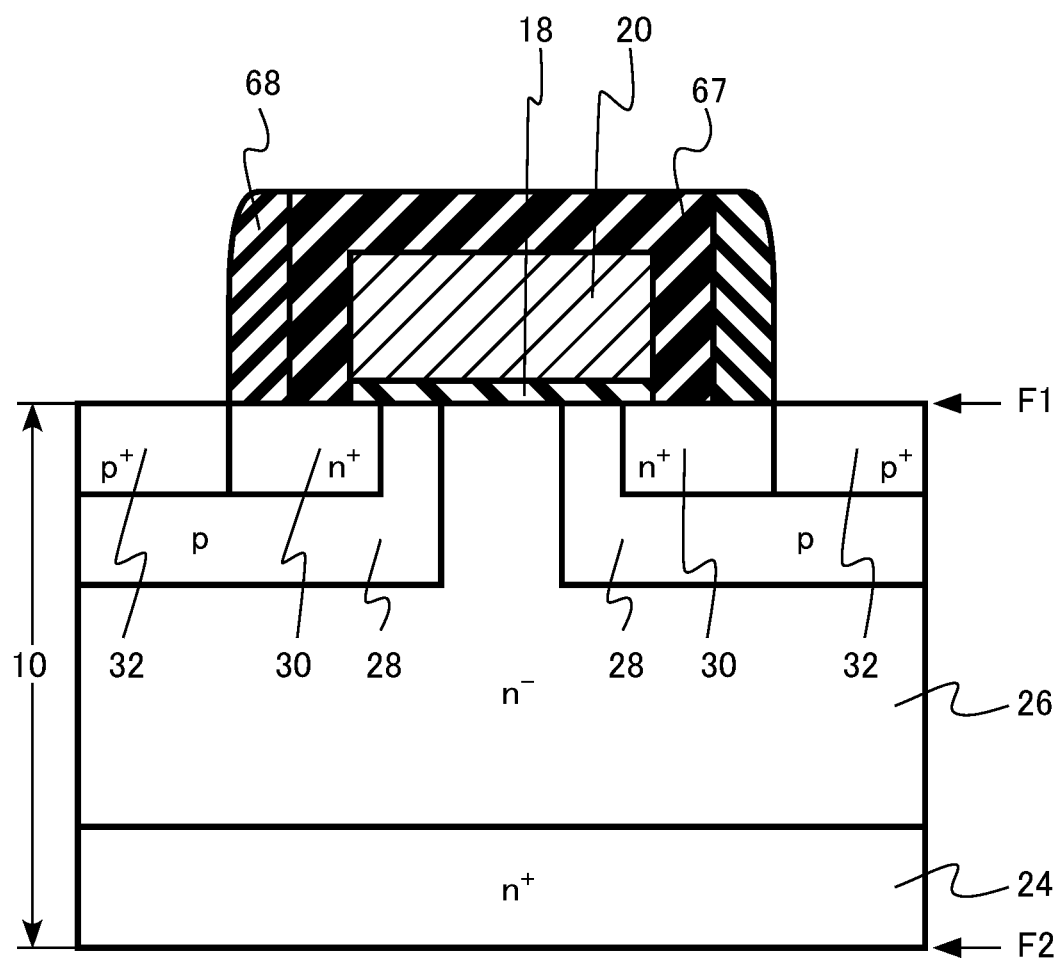
FIG. 36 is a schematic cross-sectional view illustrating a method for manufacturing a semiconductor device according to the second embodiment.

Next, a sidewall 68 is formed on a side of the contact hole 61 (FIG. 36). The sidewall 68 is formed by deposition and etching of a film by a CVD method. The sidewall 68 is formed of, for example, silicon nitride.

Figure 37:
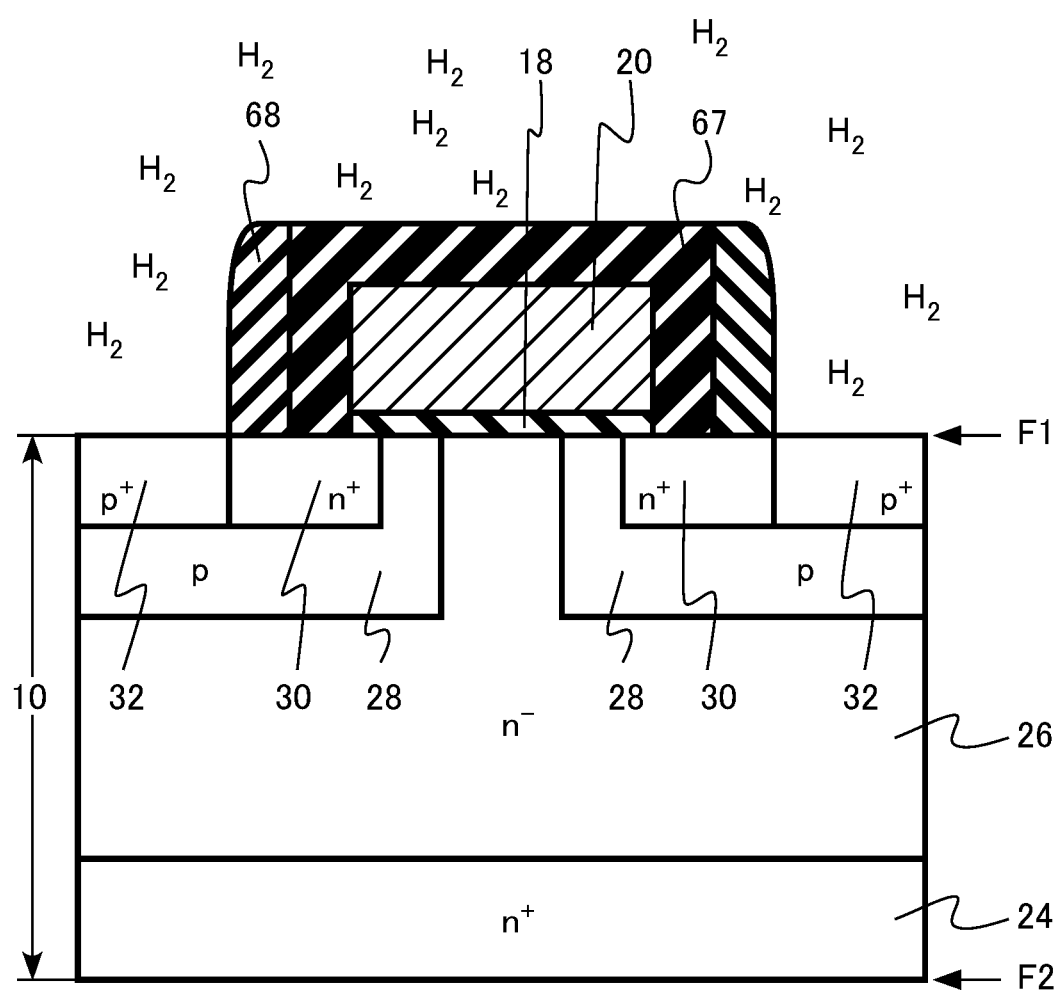
FIG. 37 is a schematic cross-sectional view illustrating a method for manufacturing a semiconductor device according to the second embodiment.

Next, the hydrogen etching treatment for etching the surface of the silicon carbide layer 10 in an atmosphere containing hydrogen gas is performed (FIG. 37). The temperature of the hydrogen etching treatment is, for example, equal to or higher than 1300° C. and equal to or lower than 1500° C. The surface of the silicon carbide layer 10 is etched by, for example, equal to or greater than 25 nm and equal to or less than 100 nm by performing the hydrogen etching treatment.

The source region 30 covered by the sidewall 68 is not etched, and the p-well contact region 32 exposed from the sidewall 68 is etched.

The partial pressure of the hydrogen gas in the atmosphere of the hydrogen etching treatment is, for example, equal to or greater than 90%. The partial pressure of the hydrogen gas in the atmosphere of the hydrogen etching treatment is, for example, equal to or greater than 95%. The partial pressure of the hydrogen gas in the atmosphere of the hydrogen etching treatment is, for example, 100%. The atmosphere of the hydrogen etching treatment may include, for example, argon gas.

Figure 38:
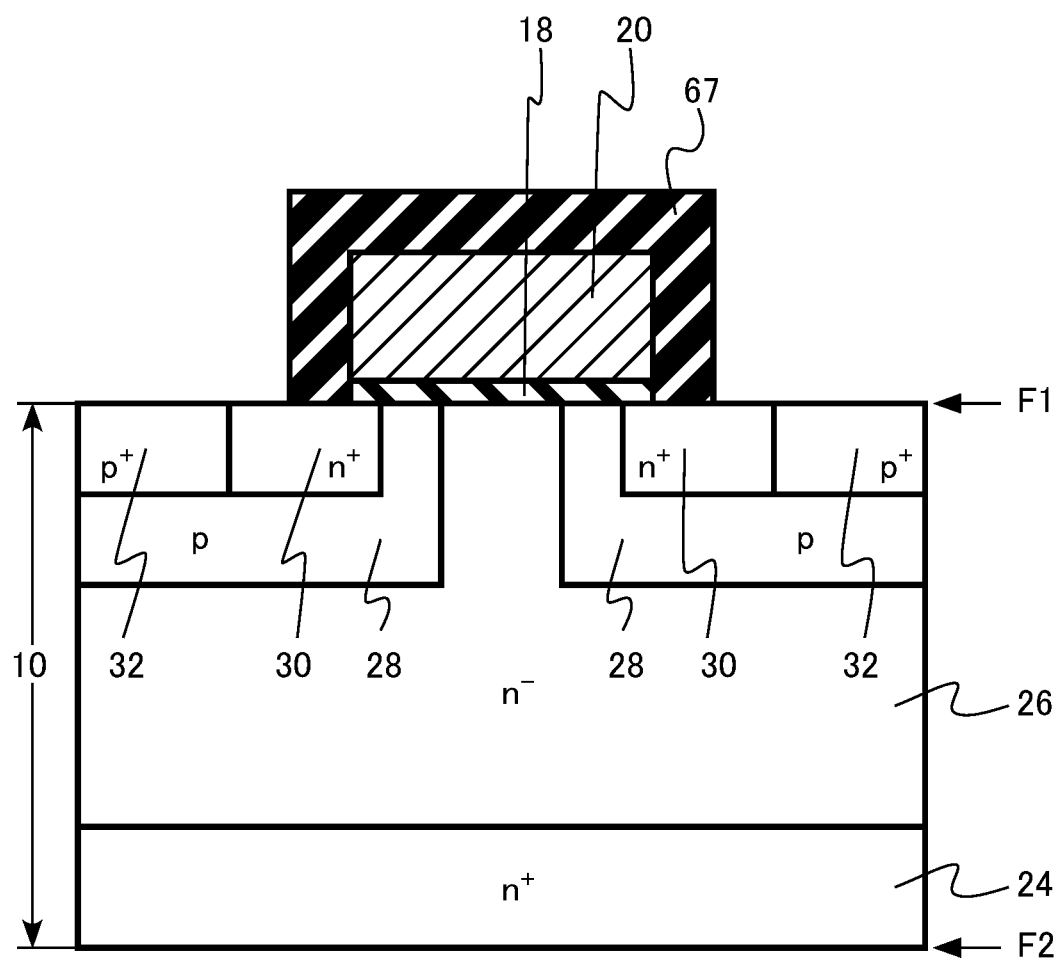
FIG. 38 is a schematic cross-sectional view illustrating a method for manufacturing a semiconductor device according to the second embodiment.

Next, the sidewall 68 is removed (FIG. 38). The sidewall 68 is removed by, for example, wet etching.

Figure 39:
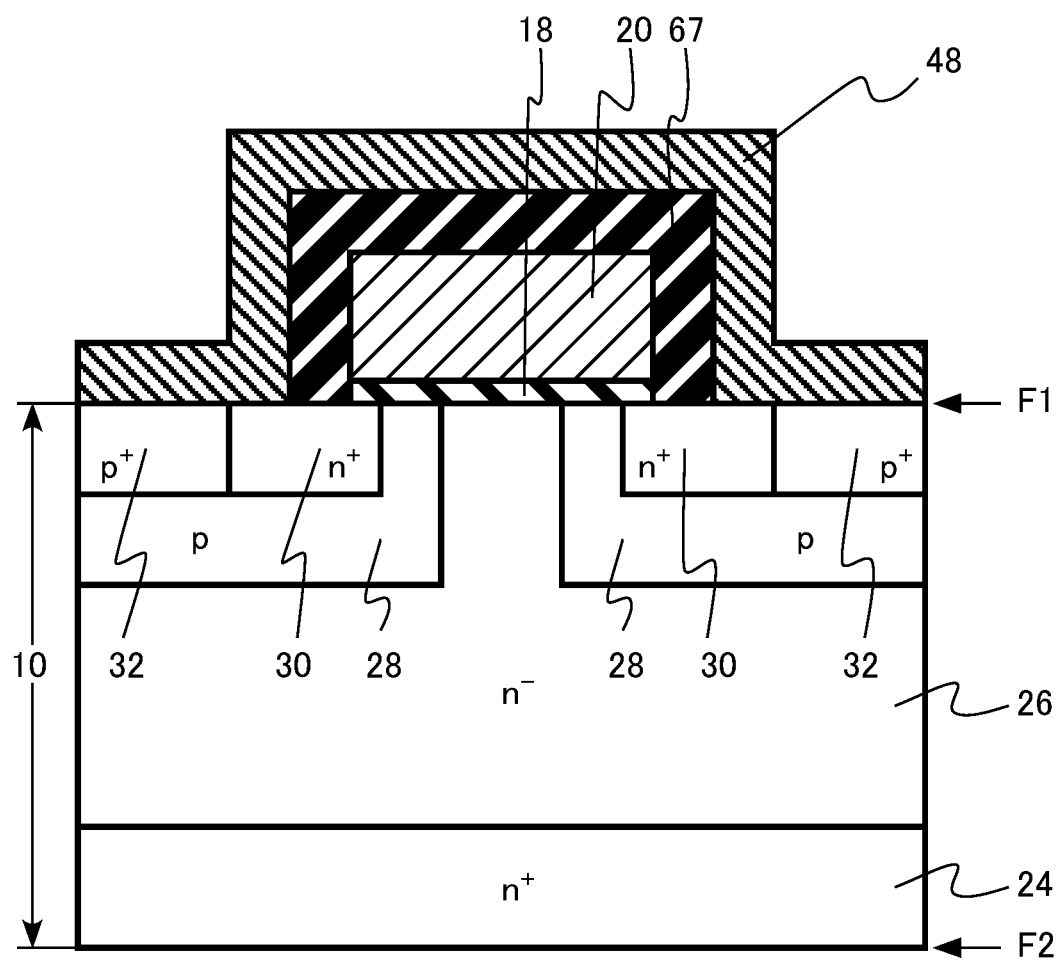
FIG. 39 is a schematic cross-sectional view illustrating a method for manufacturing a semiconductor device according to the second embodiment.

Next, a nickel film 48 is formed on the silicon carbide layer 10 (FIG. 39). The nickel film 48 is formed on the p-well contact region 32 and the source region 30. The nickel film 48 is an example of a first metal film. The nickel film 48 is formed using, for example, a sputtering method.

Figure 40:
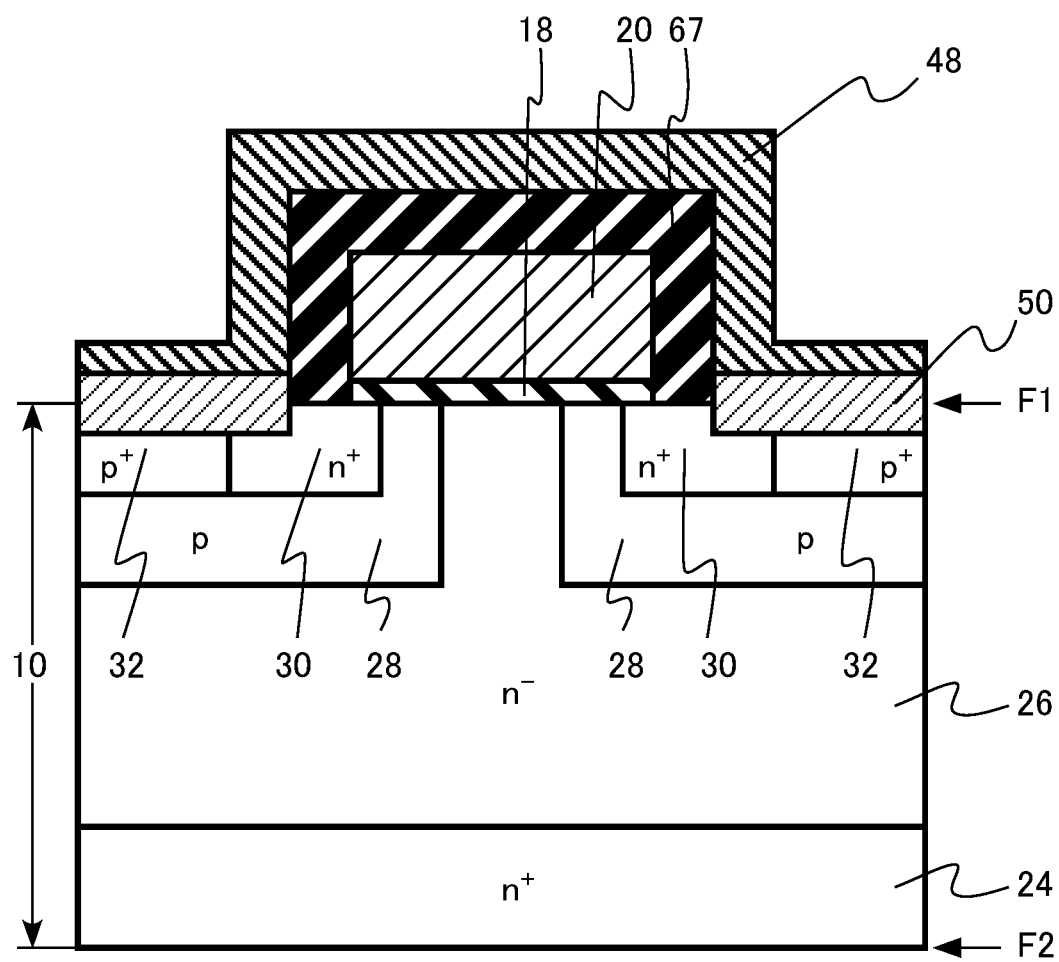
FIG. 40 is a schematic cross-sectional view illustrating a method for manufacturing a semiconductor device according to the second embodiment.

Next, silicidation annealing is performed. A nickel silicide layer 50 is formed by causing the silicon carbide layer 10 to react with the nickel film 48 by silicidation annealing (FIG. 40). The nickel silicide layer 50 is formed by causing the p-well contact region 32 and source region 30 to react with the nickel film 48. The nickel silicide layer 50 is an example of the metal silicide layer 13.

The silicidation annealing is performed, for example, in an atmosphere containing nitrogen. The silicidation annealing is performed, for example, in an atmosphere containing nitrogen gas. The temperature of the silicidation annealing is, for example, equal to or higher than 500° C. and lower than 900° C.

At the time of silicidation annealing, the nickel is diffused from the nickel film 48 into the silicon carbide layer 10. The nickel is diffused into the source region 30 and the p-well contact region 32.

Figure 41:
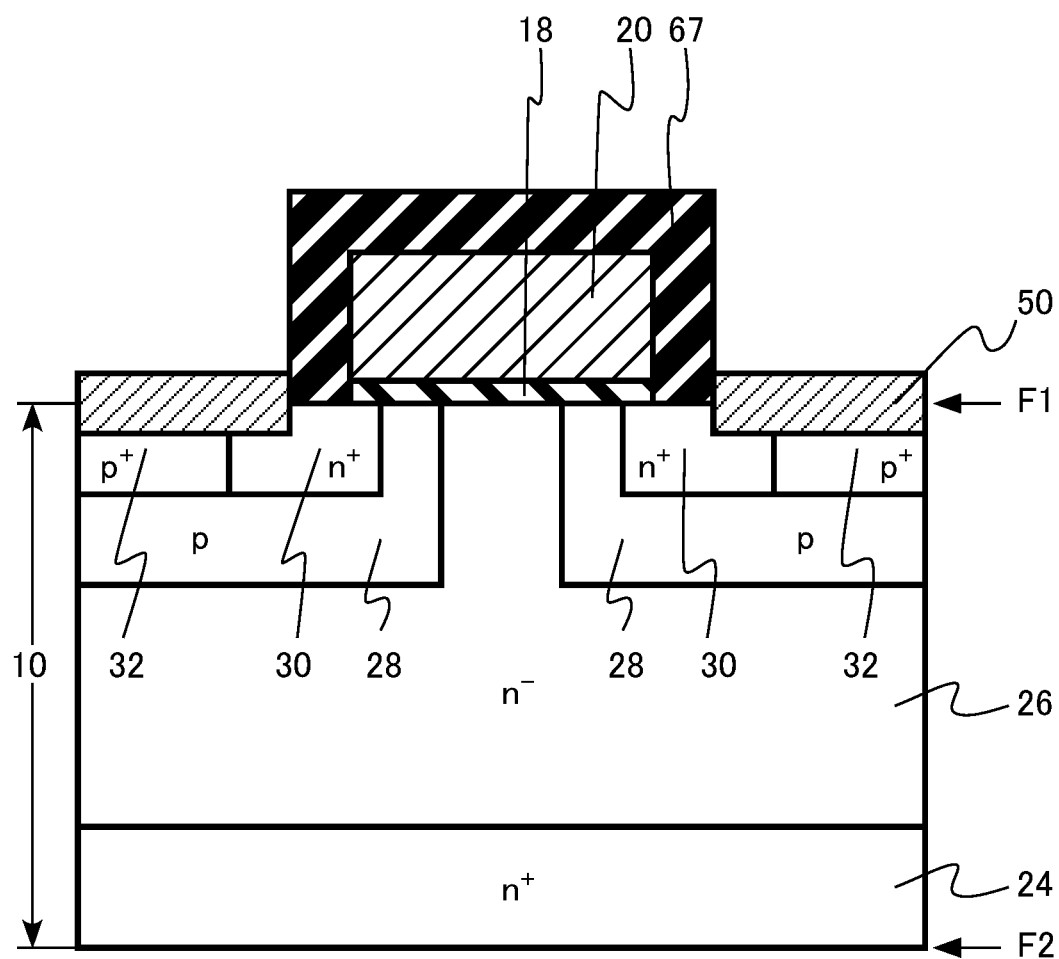
FIG. 41 is a schematic cross-sectional view illustrating a method for manufacturing a semiconductor device according to the second embodiment.

Next, an unreacted nickel film 48 is removed (FIG. 41). The unreacted nickel film is removed by, for example, wet etching.

Thereafter, an aluminum film 51 is formed on the nickel silicide layer 50. The aluminum film 51 is an example of a second metal film. The second metal film has a chemical composition different from that of the first metal film. The aluminum film 51 is formed by, for example, a sputtering method.

The aluminum film 51 is patterned to finally become the source electrode 12.

Figure 42:
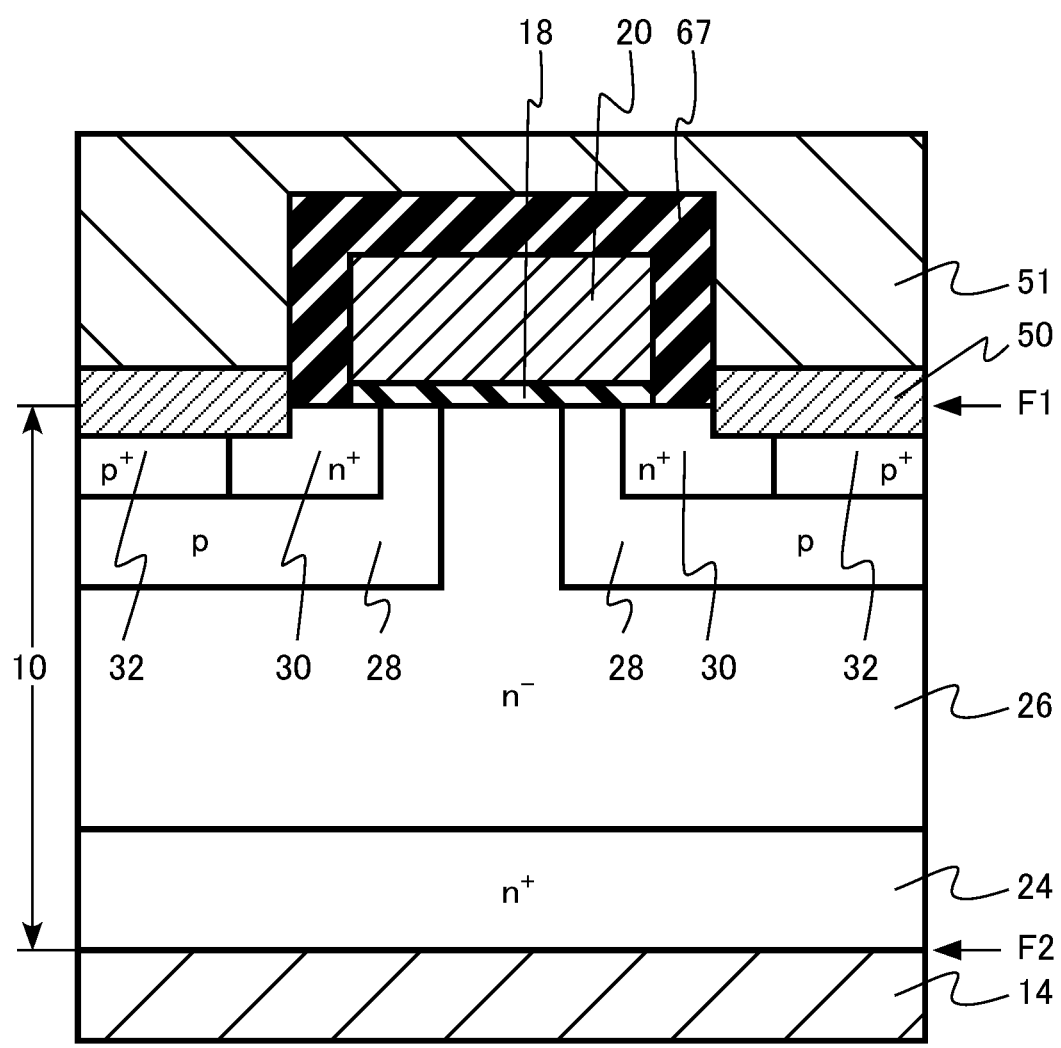
FIG. 42 is a schematic cross-sectional view illustrating a method for manufacturing a semiconductor device according to the second embodiment.

Next, a conductive drain electrode 14 is formed on the silicon carbide layer 10 side opposite to the source electrode 12 (FIG. 42). In other words, the drain electrode 14 is formed to have the drift region 26 provided between the drain electrode 14 and the source electrode 12. The drain electrode 14 is formed by, for example, sputtering a nickel film.

The MOSFET 200 illustrated in FIG. 20 is formed by the manufacturing method described above.

Next, a function and an effect of the semiconductor device according to the second embodiment and the method for manufacturing the semiconductor device will be described.

In the MOSFET 200 using silicon carbide, it is desirable to reduce the contact resistance between the n-type source region 30 and the source electrode 12 in order to reduce an on-resistance. In order to realize a stable operation, it is desirable to reduce the contact resistance between the p-type p-well contact region 32 and the source electrode 12. It is desirable to simultaneously reduce both the contact resistance between the n-type source region 30 and the source electrode 12 and the contact resistance between the p-type p-well contact region 32 and the source electrode 12.

In the MOSFET 200, the metal silicide layer 13 is provided between the source region 30 and the source electrode 12 and between the p-well contact region 32 and the source electrode 12. By using the metal silicide layer 13, the contact resistance between the source region 30 and the source electrode 12 and the contact resistance between the p-well contact region 32 and the source electrode 12 are reduced.

As described above, it is known that the contact resistance between an n-type silicon carbide region and the metal silicide layer decreases as the temperature of silicidation annealing increases. On the other hand, it is known that the contact resistance between a p-type silicon carbide region and the metal silicide layer increases as the temperature of silicidation annealing increases.

Therefore, it is difficult to simultaneously reduce both the contact resistance between the n-type source region and the source electrode and the contact resistance between the p-type p-well contact region and the source electrode.

In the method for manufacturing the MOSFET 200 of the second embodiment, when the p-well contact region 32 is formed, carbon is ion-implanted in addition to the ion implantation of aluminum. After the oxidation treatment, the surface of the p-well contact region 32 is etched by the hydrogen etching treatment before the metal silicide layer 13 is formed. By the above-described method, the amount of carbon vacancies in the silicon carbide layer 10 of the p-well contact region 32 is reduced by the same function as that of the contact structure 100 of the first embodiment.

Therefore, the contact resistance between the p-well contact region 32 and the contact electrode 11 decreases. Accordingly, it is possible to simultaneously reduce both the contact resistance between the n-type source region 30 and the source electrode 12 and the contact resistance between the p-type p-well contact region 32 and the source electrode 12.

From the viewpoint of reducing the contact resistance between the n-type source region 30 and the source electrode 12, it is preferable not to etch the source region 30 in the hydrogen etching treatment.

From the viewpoint of reducing the contact resistance between the n-type source region 30 and the source electrode 12, it is preferable to perform a process of increasing the carbon vacancies in the first region in which the source region 30 is formed. Specifically, it is preferable to perform ion implantation of argon into the source region 30.

By performing the process of increasing the carbon vacancies in the source region 30, the metal element (M) in the source region 30 easily enters the carbon site in the crystal structure of the silicon carbide. Therefore, for example, even when the temperature of the silicidation annealing is lowered to lower than 900° C., the metal element (M) easily enters the carbon site in the crystal structure of the silicon carbide. Accordingly, the donor concentration of the source electrode 12 increases, and the contact resistance between the n-type source region 30 and the source electrode 12 decreases. The ion implantation of argon (Ar) into the source region 30 can also be performed after activation annealing.

From the viewpoint of increasing the donor concentration of the source region 30, the temperature of the silicidation annealing is preferably equal to or higher than 500° C., more preferably equal to or higher than 600° C., still more preferably equal to or higher than 700° C., and still more preferably equal to or higher than 800° C.

From the viewpoint of increasing the acceptor concentration of the p-well contact region 32, the temperature of the silicidation annealing is preferably lower than 900° C.

The intensity of infrared absorption at a wave number of 838 $cm^{-1}$, which is measured by an attenuated total reflection method (ATR method) of a Fourier transform infrared spectroscopy method (FTIR method), corresponds to the density of the carbon vacancies The infrared absorption at a wave number of 838 $cm^{-1}$ corresponds to a residual product generated in the silicon carbide layer when the silicon carbide layer is oxidized. The residual product has an Si—O bond. The infrared absorption at wave number 838 $cm^{-1}$ is based on the presence of the Si—O bond.

When the silicon carbide layer is oxidized, the distortion of the lattice of the silicon carbide is caused to form the carbon vacancies. Therefore, a portion of the silicon carbide layer in which the density of the residual product is high has a high density of carbon vacancies.

In the MOSFET 200 of the second embodiment, a ratio of intensity of infrared absorption at a wave number of 838 $cm^{-1}$ with respect to the intensity of the infrared absorption at a wave number of 970 $cm^{-1}$, which is measured by an attenuated total reflection method (ATR method) of a Fourier transform infrared spectroscopy method (FTIR method), is a first value in the vicinity of the surface of the p-well contact region 32. The ratio of intensity of infrared absorption at a wave number of 838 $cm^{-1}$ with respect to the intensity of the infrared absorption at a wave number of 970 $cm^{-1}$, which is measured by an attenuated total reflection method (ATR method) of a Fourier transform infrared spectroscopy method (FTIR method), is a second value in the vicinity of the surface of the source region 30. The infrared absorption at a wave number of 970 $cm^{-1}$ corresponds to a longitudinal optical phonon mode of the silicon carbide. The intensity of the infrared absorption at a wave number of 970 $cm^{-1}$ is used to normalize the intensity of the infrared absorption at a wave number of 838 $cm^{-1}$.

The second value is higher than the first value. In other words, the carbon vacancy density in the vicinity of the surface of the source region 30 is higher than the carbon vacancy density in the vicinity of the surface of the p-well contact region 32. Therefore, in the MOSFET 200, both the contact resistance between the n-type source region 30 and the source electrode 12 and the contact resistance between the p-type p-well contact region 32 and the source electrode 12 are simultaneously reduced.

Therefore, from the viewpoint of simultaneously reducing both the contact resistance between the n-type source region 30 and the source electrode 12 and the contact resistance between the p-type p-well contact region 32 and the source electrode 12, the second value is preferably equal to or greater than two times the first value, and more preferably equal to or greater than five times the first value.

In the MOSFET 200 according the second embodiment and the method for manufacturing the MOSFET 200, both the contact resistance between the source region 30 and the source electrode 12 and the contact resistance between the p-well contact region 32 and the source electrode 12 are simultaneously reduced. Therefore, the operation of the MOSFET 200, in which the on-resistance is reduced and stable, is realized.

It is also possible to etch the source region 30 and the p-well contact region 32 in the hydrogen etching treatment without forming the sidewall 68 before the etching treatment.

It is also possible to remove the nickel silicide layer after forming the nickel silicide layer and before forming the aluminum film 51. In this case, the aluminum film 51 is in contact with the source region 30 and the p-well contact region 32.

As described above, according to the second embodiment, it is possible to realize a semiconductor device capable of reducing the contact resistance between the silicon carbide layer and the metal electrode.

Third Embodiment

An inverter circuit and a driving device according to the third embodiment are an inverter circuit and a driving device, which include the semiconductor device of the second embodiment.

Figure 43:
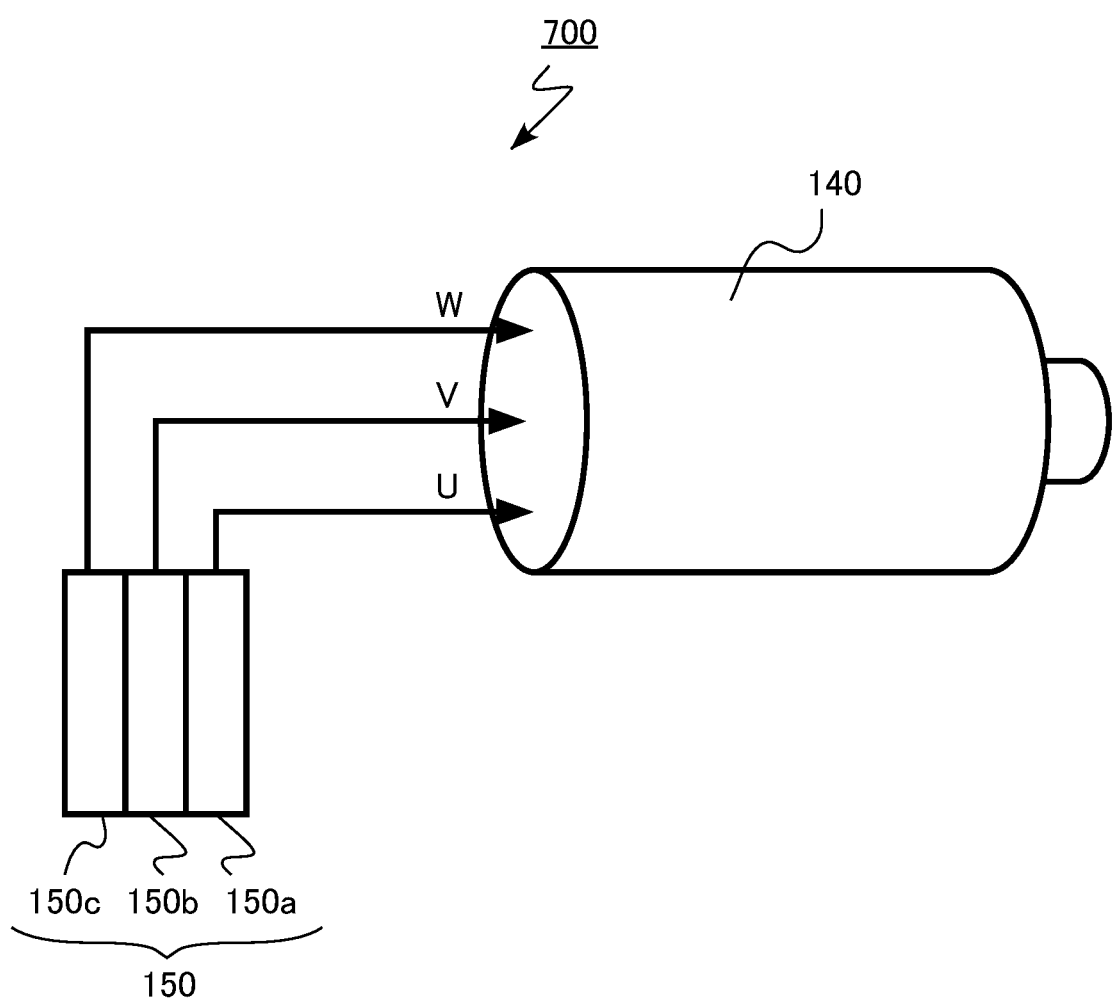
FIG. 43 is a schematic view of a driving device according to a third embodiment.

FIG. 43 is a schematic view of the driving device according to the third embodiment. A driving device 700 includes a motor 140 and an inverter circuit 150.

The inverter circuit 150 includes three semiconductor modules 150*a*, 150*b*, and 150*c* using the MOSFET 200 of the second embodiment as a switching element. By connecting three semiconductor modules 150*a*, 150*b*, and 150*c* in parallel, a three-phase inverter circuit 150 including three AC voltage output terminals U, V, and W is realized. The motor 140 is driven by an AC voltage output from the inverter circuit 150.

According to the third embodiment, the property of the inverter circuit 150 and the property of the driving device 700 are improved by including the MOSFET 200 with improved property.

Fourth Embodiment

A vehicle according to the fourth embodiment is a vehicle including the semiconductor device according to the second embodiment.

Figure 44:
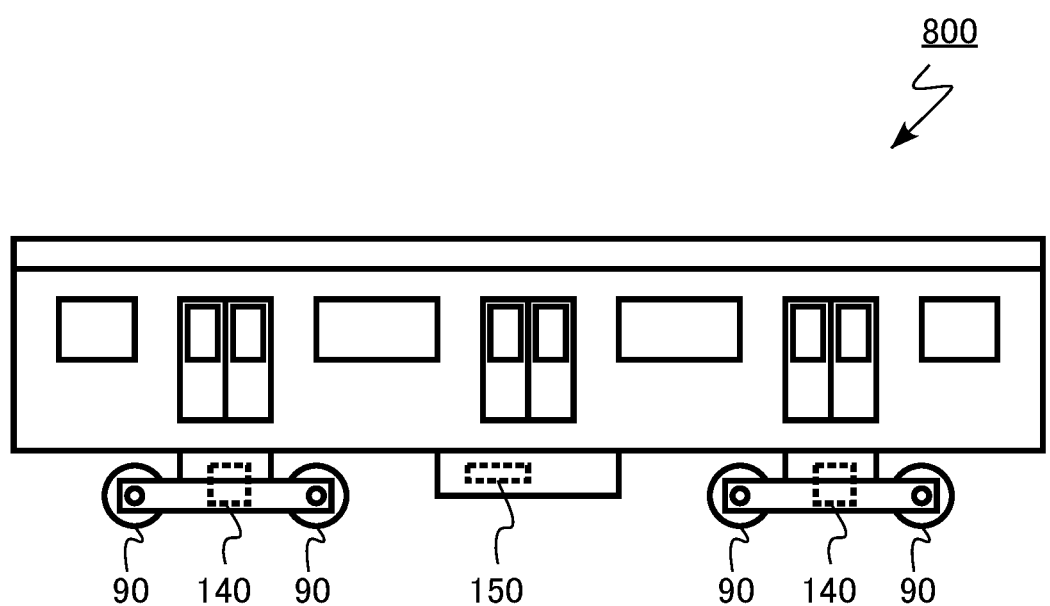
FIG. 44 is a schematic view of a vehicle according to a fourth embodiment.

FIG. 44 is a schematic view of the vehicle according to the fourth embodiment. A vehicle 800 of the fourth embodiment is a railway vehicle. The vehicle 800 includes a motor 140 and an inverter circuit 150.

The inverter circuit 150 includes three semiconductor modules using the MOSFET 200 of the second embodiment as a switching element. By connecting three semiconductor modules in parallel, a three-phase inverter circuit 150 including three AC voltage output terminals U, V, and W is realized. The motor 140 is driven by an AC voltage output from the inverter circuit 150. Wheels 90 of the vehicle 800 are rotated by the motor 140.

According to the fourth embodiment, the property of the vehicle 800 is improved by including the MOSFET 200 with improved property.

Fifth Embodiment

A vehicle according to the fifth embodiment is a vehicle including the semiconductor device according to the second embodiment.

Figure 45:
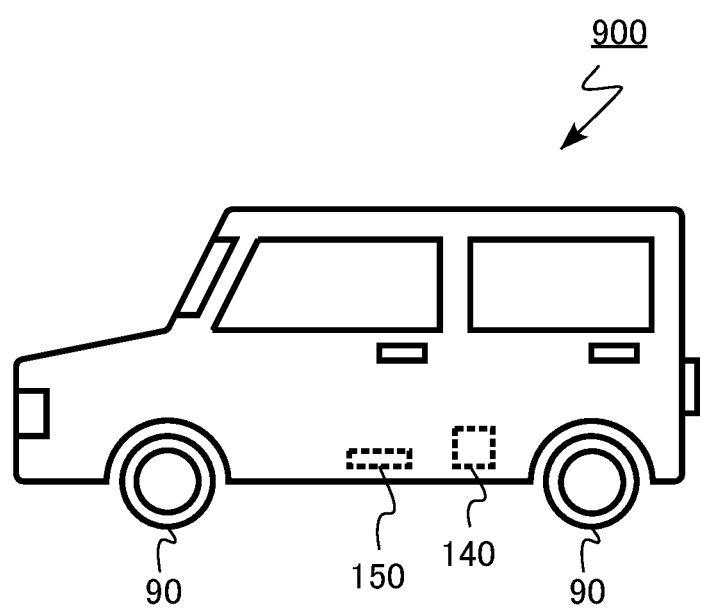
FIG. 45 is a schematic view of a vehicle according to a fifth embodiment.

FIG. 45 is a schematic view of the vehicle according to the fifth embodiment. A vehicle 900 of the fifth embodiment is an automobile. The vehicle 900 includes a motor 140 and an inverter circuit 150.

The inverter circuit 150 includes three semiconductor modules using the MOSFET 200 of the first embodiment as a switching element. By connecting three semiconductor modules in parallel, a three-phase inverter circuit 150 including three AC voltage output terminals U, V, and W is realized.

The motor 140 is driven by an AC voltage output from the inverter circuit 150. Wheels 90 of the vehicle 900 are rotated by the motor 140.

According to the fifth embodiment, the property of the vehicle 900 is improved by including the MOSFET 200 with improved property.

Sixth Embodiment

An elevator according to the sixth embodiment is an elevator including the semiconductor device according to the second embodiment.

Figure 46:
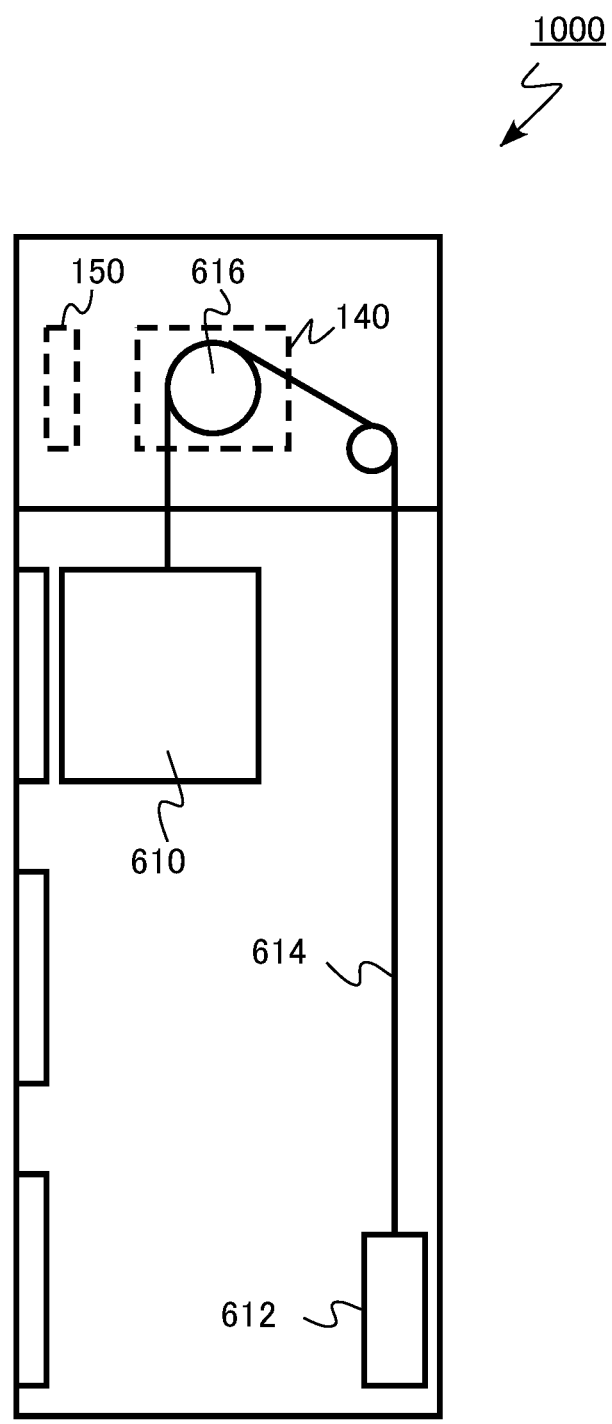
FIG. 46 is a schematic view of an elevator according to a sixth embodiment.

FIG. 46 is a schematic view of an elevator according to the sixth embodiment. An elevator 1000 of the sixth embodiment includes a car 610, a counterweight 612, a wire rope 614, a hoisting machine 616, a motor 140, and an inverter circuit 150.

The inverter circuit 150 includes three semiconductor modules using the MOSFET 200 of the second embodiment as a switching element. By connecting three semiconductor modules in parallel, a three-phase inverter circuit 150 including three AC voltage output terminals U, V, and W is realized.

The motor 140 is driven by an AC voltage output from the inverter circuit 150. The hoisting machine 616 is rotated by the motor 140, and the car 610 moves up and down.

According to the sixth embodiment, the property of the elevator 1000 is improved by including the MOSFET 200 with improved property.

As described above, in the first and second embodiments, the case of 4H—SiC has been described as an example of the crystal structure of silicon carbide, but the present disclosure can also be applied to silicon carbide having other crystal structures such as 3C—SiC and 6H—SiC.

The present disclosure can also be applied to the semiconductor device using other silicon carbide, such as a diode and an insulated gate bipolar transistor (IGBT).

The present disclosure can also be applied to a transistor having a trench gate structure in which a gate electrode is provided in a trench instead of a planar gate transistor.

The present disclosure can also be applied to a lateral transistor in which the source electrode and the drain electrode are provided on the same surface of the silicon carbide layer, instead of a vertical transistor.

In the first and second embodiments, the case where the n-type impurity is nitrogen or phosphorus has been described as an example, but arsenic (As) or antimony (Sb) can also be applied as the n-type impurity.

In the first and second embodiments, the case where the p-type impurity is aluminum has been described as an example, but boron (B), gallium (Ga), and indium (In) can also be applied as the p-type impurity.

In the third to sixth embodiments, the case where the semiconductor device of the present disclosure is applied to a vehicle or an elevator has been described as an example. However, the semiconductor device of the present disclosure can also be applied to, for example, a power conditioner of a solar power generation system.

While certain embodiments have been described, these embodiments have been presented by way of example only, and are not intended to limit the scope of the inventions. Indeed, a method for manufacturing a semiconductor device, a semiconductor device, an inverter circuit, a driving device, a vehicle, and an elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, the method comprising:
   performing first ion implantation of ion-implanting a p-type impurity into a silicon carbide layer in a first projected range and by a first dose amount;
   performing second ion implantation of ion-implanting carbon (C) into the silicon carbide layer in a second projected range and by a second dose amount;
   performing a first heat treatment activating the p-type impurity;
   performing a first oxidation treatment oxidizing the silicon carbide layer;
   performing an etching treatment etching the silicon carbide layer in an atmosphere containing hydrogen gas;
   forming a first metal film on the silicon carbide layer, the first metal film containing at least one metal element selected from a group consisting of nickel (Ni), palladium (Pd), platinum (Pt), and chromium (Cr);
   performing a second heat treatment causing the silicon carbide layer to react with the first metal film to form a metal silicide layer containing the at least one metal element; and
   forming a second metal film on the silicon carbide layer, the second metal film having a chemical composition different from a chemical composition of the first metal film.

2. The method for manufacturing a semiconductor device according to claim 1, wherein the silicon carbide layer is etched by equal to or greater than 25 nm when the etching treatment is performed.

3. The method for manufacturing a semiconductor device according to claim 1, further comprising:
forming a carbon film on the silicon carbide layer after the performing the first ion implantation and before the performing the first heat treatment, wherein
the first oxidation treatment is an ashing treatment removing the carbon film in oxygen plasma.

4. The method for manufacturing a semiconductor device according to claim 1, further comprising:
forming an insulating layer on the silicon carbide layer after the performing the first oxidation treatment and before the performing the etching treatment; and
forming an opening through which the silicon carbide layer is exposed in the insulating layer, wherein
the silicon carbide layer exposed at the opening is etched in the etching treatment.

5. The method for manufacturing a semiconductor device according to claim 4, further comprising a second oxidation treatment of oxidizing the silicon carbide layer exposed at the opening after the forming the opening and before the performing the etching treatment.

6. The method for manufacturing a semiconductor device according to claim 1, wherein the p-type impurity is aluminum (Al).

7. The method for manufacturing a semiconductor device according to claim 1, wherein the second dose amount is greater than the first dose amount.

8. The method for manufacturing a semiconductor device according to claim 1, wherein the first dose amount is equal to or greater than $1 \times 10^{15}$ cm$^{-2}$.

9. The method for manufacturing a semiconductor device according to claim 1, wherein the second projected range is equal to or greater than 80% and equal to or less than 120% of the first projected range.

10. The method for manufacturing a semiconductor device according to claim 1, further comprising:
removing the metal silicide layer after the forming the metal silicide layer and before the forming the second metal film.

11. A method for manufacturing a semiconductor device, the method comprising:
performing first ion implantation of ion-implanting a p-type impurity into a first region of a silicon carbide layer;
performing second ion implantation of ion-implanting carbon (C) into the first region;
performing a third ion implantation of ion-implanting an n-type impurity into a second region of the silicon carbide layer;
performing a first heat treatment activating the n-type impurity and the p-type impurity;
forming a gate insulating layer on the silicon carbide layer;
forming a gate electrode on the gate insulating layer;
performing an etching treatment etching at least the first region in an atmosphere containing hydrogen gas after the forming the gate electrode;
forming a first metal film on the first region and the second region, the first metal film containing at least one metal element selected from a group consisting of nickel (Ni), palladium (Pd), platinum (Pt), and chromium (Cr);
performing a second heat treatment causing the first region and second region to react with the first metal film to form a metal silicide layer containing the at least one metal element; and
forming a second metal film on the first region and the second region, the second metal film having a chemical composition different from a chemical composition of the first metal film.

12. The method for manufacturing a semiconductor device according to claim 11, further comprising:
performing an oxidation treatment of oxidizing the silicon carbide layer after the performing the first heat treatment and before the performing the etching treatment.

13. The method for manufacturing a semiconductor device according to claim 11, further comprising:
forming an insulating layer on the silicon carbide layer after the forming the gate electrode and before the performing the etching treatment; and
forming an opening through which at least the first region is exposed in the insulating layer, wherein
the first region exposed at the opening is etched in the etching treatment.

14. The method for manufacturing a semiconductor device according to claim 11, wherein the first region and the second region are etched in the etching treatment.

15. The method for manufacturing a semiconductor device according to claim 11, wherein the first region is etched by equal to or greater than 25 nm when the etching treatment is performed.

16. The method for manufacturing a semiconductor device according to claim 11, further comprising:
performing an ion implantation of ion-implanting argon into the second region before the performing the first heat treatment.

17. The method for manufacturing a semiconductor device according to claim 11, wherein a temperature of the second heat treatment is less than 900° C.

* * * * *